(12) United States Patent
Dehghanian et al.

(10) Patent No.: US 11,527,891 B2
(45) Date of Patent: Dec. 13, 2022

(54) SMART SENSOR FOR ONLINE SITUATIONAL AWARENESS IN POWER GRIDS

(71) Applicant: The George Washington University, Washington, DC (US)

(72) Inventors: Payman Dehghanian, Fairfax, VA (US); Shiyuan Wang, Rockville, MD (US)

(73) Assignee: The George Washington University, Washington, DC (US)

( * ) Notice: Subject to any disclaimer, the term of this patent is extended or adjusted under 35 U.S.C. 154(b) by 442 days.

(21) Appl. No.: 16/699,602

(22) Filed: Nov. 30, 2019

(65) Prior Publication Data

US 2020/0212676 A1    Jul. 2, 2020

Related U.S. Application Data

(60) Provisional application No. 62/782,842, filed on Dec. 20, 2018.

(51) Int. Cl.
*H02J 3/26* (2006.01)
*G06N 3/04* (2006.01)
(Continued)

(52) U.S. Cl.
CPC ............. *H02J 3/26* (2013.01); *G06F 17/148* (2013.01); *G06N 3/04* (2013.01); *H03M 7/30* (2013.01)

(58) Field of Classification Search
CPC ........ H02J 3/26; H02J 2203/20; H02J 3/0012; H02J 3/00125; H02J 3/242; G06F 17/148;
(Continued)

(56) References Cited

U.S. PATENT DOCUMENTS 9,214,836 B2 * 12/2015 Flammer, III .... H02J 13/00002
2006/0235574 A1 * 10/2006 Lapinski ........... H02J 13/00028
700/286
(Continued)

OTHER PUBLICATIONS

Baqui, I., et al., "High Impedance Faults Detection in Power Distribution System by Combination of Artificial Neural Network and Wavelet Transform," 18th International Conference on Electricity Distribution, Turin, Jun. 6-9, 2005.*
(Continued)

*Primary Examiner* — Xuemei G Chen
(74) *Attorney, Agent, or Firm* — Blank Rome LLLP

(57) ABSTRACT

Waveforms in power grids typically reveal a certain pattern with specific features and peculiarities driven by the system operating conditions, internal and external uncertainties, etc. This prompts an observation of different types of waveforms at the measurement points (substations). An innovative next-generation smart sensor technology includes a measurement unit embedded with sophisticated analytics for power grid online surveillance and situational awareness. The smart sensor brings additional levels of smartness into the existing phasor measurement units (PMUs) and intelligent electronic devices (IEDs). It unlocks the full potential of advanced signal processing and machine learning for online power grid monitoring in a distributed paradigm. Within the smart sensor are several interconnected units for signal acquisition, feature extraction, machine learning-based event detection, and a suite of multiple measurement algorithms where the best-fit algorithm is selected in real-time based on the detected operating condition. Embedding such analytics within the sensors and closer to where the data is generated, the distributed intelligence mechanism mitigates the potential risks to communication failures and latencies, as well as malicious cyber threats, which would otherwise compromise the trustworthiness of the end-use
(Continued)

applications in distant control centers. The smart sensor achieves a promising classification accuracy on multiple classes of prevailing conditions in the power grid and accordingly improves the measurement quality across the power grid.

20 Claims, 10 Drawing Sheets

(51) Int. Cl.
  *H03M 7/30* (2006.01)
  *G06F 17/14* (2006.01)
(58) Field of Classification Search
  CPC ...... G06N 3/04; G06N 3/0445; G06N 3/0481; G06N 3/08; G06N 3/0454; H03M 7/30; H03M 7/3059; Y02E 40/70; Y02E 60/00; Y02E 40/50; Y04S 10/22; Y04S 40/20; G01R 19/2513
  See application file for complete search history.

(56) References Cited

U.S. PATENT DOCUMENTS

| | | | |
|---|---|---|---|
| 2016/0239010 A1* | 8/2016 | McDaniel | H02J 13/00002 |
| 2017/0336465 A1* | 11/2017 | Pignati | G01R 31/088 |
| 2018/0159879 A1* | 6/2018 | Mestha | G06N 3/0454 |
| 2019/0311442 A1* | 10/2019 | Helsel | G06Q 50/06 |
| 2020/0021134 A1* | 1/2020 | Caruso | H04Q 9/00 |
| 2020/0200806 A1* | 6/2020 | Derviskadic | G01R 19/2509 |
| 2020/0218973 A1* | 7/2020 | Pi | G06F 16/2474 |
| 2020/0273120 A1* | 8/2020 | Kirihara | G06N 5/04 |

OTHER PUBLICATIONS

Rohan, A., et al., "Fault Detection and Diagnosis System for a Three-Phase Inverter Using a DWT-Based Artificial Neural Network," International Journal of Fuzzy Logic and Intelligent Systems, vol. 16, No. 4, Dec. 2016, pp. 238-245.*
J. A. de la O Serna, "Synchrophasor Measurement with Polynomial Phase-Locked-Loop Taylor-Fourier Filters", IEEE Transactions on Instrumentation and Measurement, vol. 64, No. 2, Feb. 2015, pp. 328-337.
M. Bertocco, et al., "Compressive Sensing of a Taylor-Fourier Multifrequency Model for Synchrophasor Estimation", IEEE Transactions on Instrumentation and Measurement, vol. 64, No. 12, Dec. 2015, pp. 3274-3283.
M. H. R. Koochi, et. al., "A Synchrophasor-Based Decision Tree Approach for Identification of Most Coherent Generating Units", IEEE, 2018, pp. 71-76.
S. Wang, et al., "A Data-Driven Algorithm for Online Power Grid Topology Change Identification with PMUs", IEEE, 5 pgs.
T. Becejac, et al., "Analysis of PMU Algorithm Errors During Fault Transients and Out-of-Step Disturbances", 2016 IEEE PES Transmission & Distribution Conference and Exposition; 6 pgs.
"IEEE Standard for Synchrophasor Measurements for Power Systems", IEEE Standards Association, Dec. 2011, 61 pgs.
D. Macii, et al., "Accuracy Analysis and Enhancement of DFT-Based Synchrophasor Estimators in Off-Nominal Conditions", IEEE Transactions on instrumentation and Measurement, vol. 61, No. 10, Oct. 2012, pp. 2653-2664.
J. Liu, et al., "Fundamental and Harmonic Synchrophasors Estimation using Modified Taylor-Kalman Filter", IEEE, 2012, 6 pgs.

J. A. de la O Serna, et al., "Taylor-Kalman-Fourier Filters for Instantaneous Oscillating Phasor and Harmonic Estimates", IEEE Transactions on Instrumentation and Measurement, vol. 61, No. 4, Apr. 2012, pp. 941-950.
V. V. Terzija, et al., "Voltage Phasor and Local System Frequency Estimation using Newton Type Algorithm", IEEE Transactions on Power Delivery, vol. 9, No. 3, Jul. 1994, pp. 1368-1374.
M. Chen, et al., "Positive Sequence Detector Based on Cascaded Delayed Quadrature Signal Cancellation", IEEE, 2015, pp. 1089-1094.
S. Golestan, et al., "Conventional Synchronous Reference Frame Phase-Locked Loop is an Adaptive Complex Filter", IEEE Transactions on Industrial Electronics, vol. 62, No. 3, Mar. 2015, pp. 1679-1682.
S. Wang, et al., "Advanced Control Solutions for Enhanced Resilience of Modern Power-Electronic-Interfaced Distribution Systems", J. Mod. Power Syst. Clean Energy, 2019, vol. 7, No. 4, pp. 716-730.
T. Becejac, et al., "Probabilistic Assessment of PMU Integrity for Planning of Periodic Maintenance and Testing", IEEE, 2016, 6 pgs.
D. P. Mishra, et al., "A Combined Wavelet and Data-Mining Based Intelligent Protection Scheme for Microgrid", IEEE Transactions on Smart Grid, vol. 7, No. 5, Sep. 2016, pp. 2295-2304.
S. Wang, et al., "A Machine Learning Approach to Detection of Geomagneticaty Induced Currents in Power Grids", IEEE, 7 pgs.
Y.-C. Su, et al., "Feature Selection of Non-Intrusive Load Monitoring System using STFT and Wavelet Transform", 2011 Eigth IEEE International Conference on e-Business Engineering, IEEE, 2011, pp. 293-298.
I. Bayram, "An Analytic Wavelet Transform with a Flexible Time-Frequency Covering", IEEE Transactions on Signal Processing, vol. 61, No. 5, Mar. 2013, pp. 1131-1142.
S. Mallat, "A Wavelet Tour of Signal Processing", 851 pgs.
S. Mallat, et al., "Singularity Detection and Processing with Wavelets", IEEE Transactions on Information Theory, vol. 38, No. 2, Mar. 1992, pp. 617-643.
I. Goodfellow, et al., "Deep Learning", An MIT Press Book, 2016, pgs.
A. Krizhevsky, et al., "ImageNet Classification with Deep Convolutional Neural Networks", 9 pgs.
K. Simonyan, et al., "Very Deep Convolutional Networks for Large-Scale Image Recognition", Published as a conference paper at ICLR, 2015, 14 pgs.
L. A. Gatys, "Image Style Transfer using Convolutional Neural Networks", Computer Vision Foundation, pp. 2414-2423.
Y. Bengio, et al., "Representation Learning: A Review and New Perspectives", Apr. 2014, 30 pgs.
Z. Zhang, et al., "Comparison Between Geometry-Based and Gabor-Wavelets-Based Facial Expression Recognition using Multi-Layer Perceptron", 6 pgs.
B. S. Manjunath, et al., "Texture Features for Browsing and Retrieval of Image Data", IEEE Transactions on Pattern Analysis and Machine Intelligence, vol. 18, No. 8, IEEE, Aug. 1996, pp. 837-842.
J. V. B. Soares, et al., "Retinal Vessel Segmentation using the 2-D Gabor Wavelet and Supervised Classification", IEEE Transactions on Medical Imaging, vol. 25, No. 9, Sep. 2006, pp. 1214-1222.
S. Wang, et al., "On the Use of Artificial Intelligence for High Impedance Fault Detection and Electrical Safety", IEEE Transactions on Industry Applications, vol. 56, No. 6, Nov./Dec. 2020, 9 pgs.
S. Wang, et al., "Distributed Intelligence for Online Situational Awareness in Power Grids", IEEE Transactions on Power Systems, vol. 37, No. 4, Jul. 2022, 17 pgs.

* cited by examiner

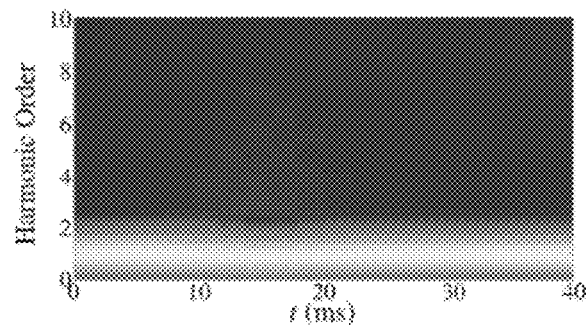
FIG. 3(a) STFT
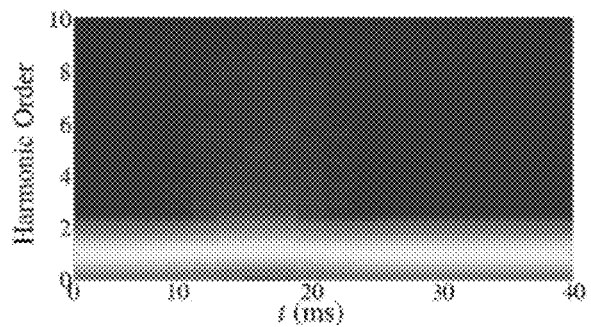
FIG. 3(b) STFT
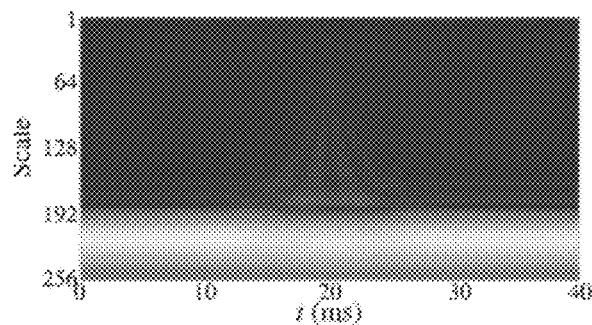
FIG. 3(c) Morlet
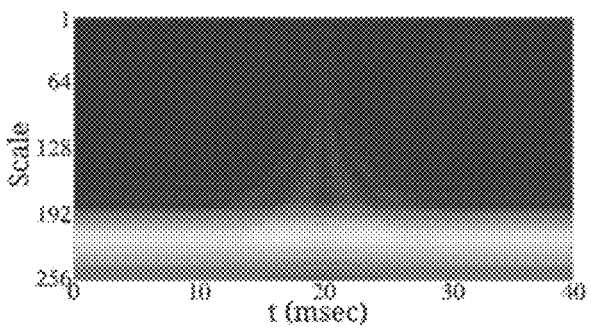
FIG. 3(d) Morlet
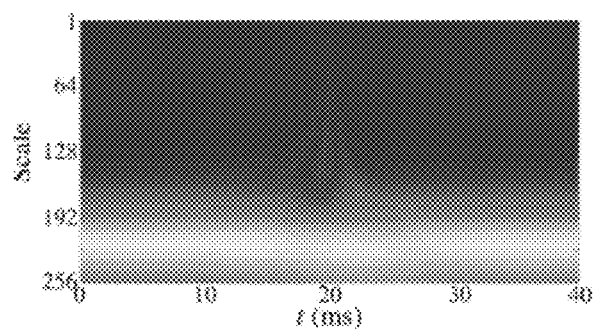
FIG. 3(e) DB4
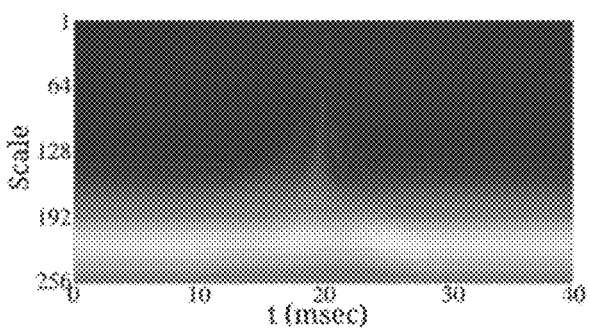
FIG. 3(f) DB4

(a) Scalogram of the $\alpha\beta$-frame waveform (b) Scalogram of the single-phase waveform

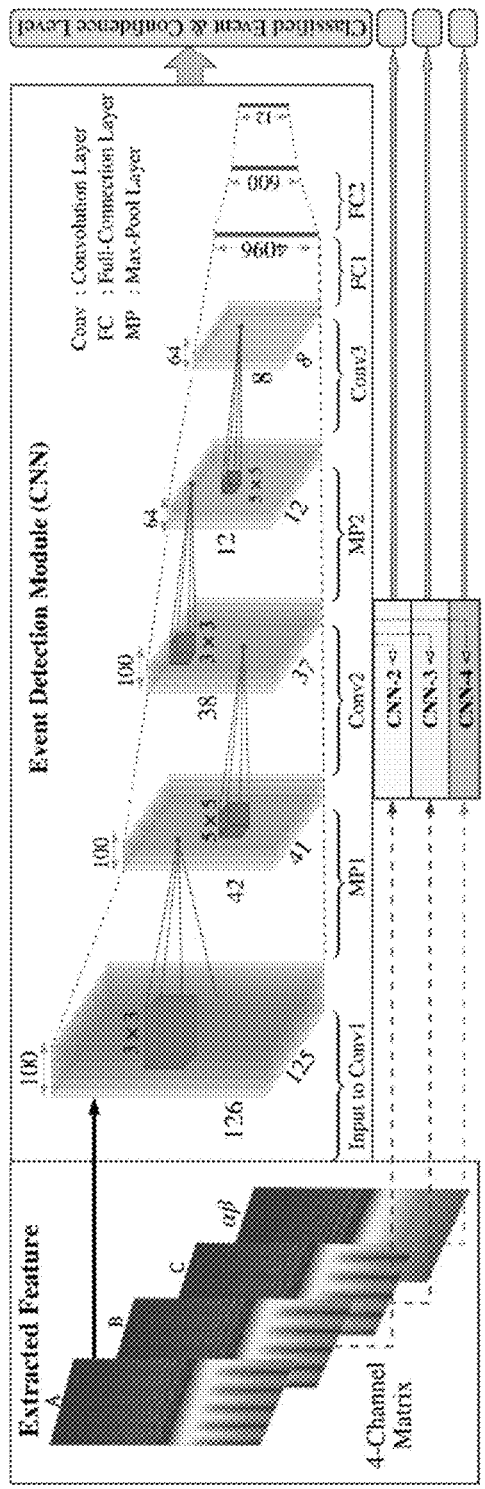
FIG. 12
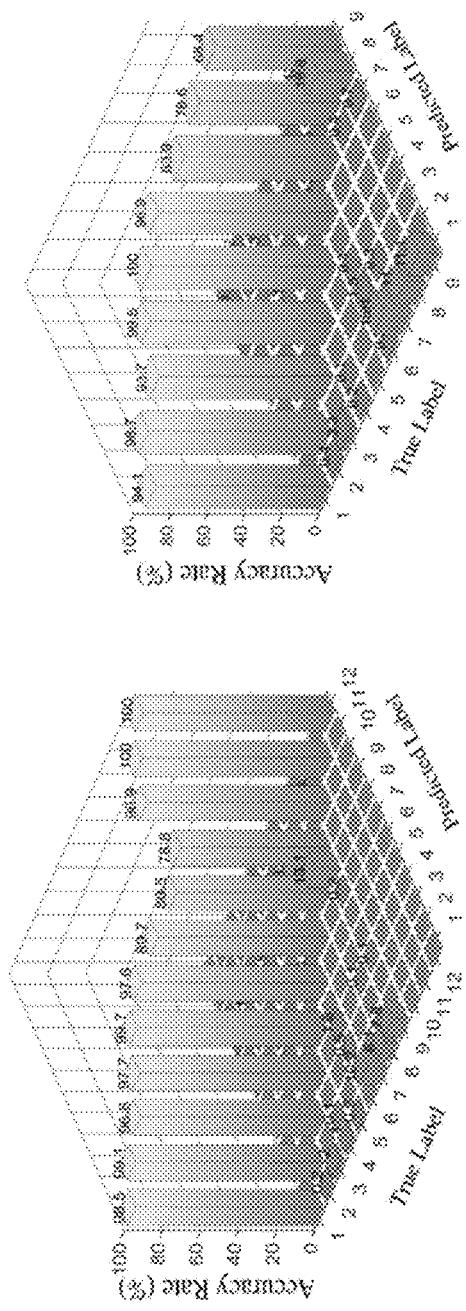
FIG. 13(a) αβ-Frame
FIG. 13(b) Single Phase
FIG. 13(c) Event Indexing
1: Normal    2: Frequency Step    3: Magnitude Step    4: Phase Step    5: Harmonic Distortion    6: Out-of-Band
7: Amplitude Modulation    8: Angle Modulation    9: Frequency Ramp    10: SLG Fault    11: LL Fault    12: LLG Fault

SMART SENSOR FOR ONLINE SITUATIONAL AWARENESS IN POWER GRIDS

RELATED APPLICATIONS

This application claims the benefit of U.S. Provisional Application No. 62/782,842, filed Dec. 20, 2018, the entire contents of which are incorporated herein by reference.

GOVERNMENT LICENSE RIGHTS

This invention was made with Government support under the Electricity Industry Technology and Practices Innovation Challenge (EITPIC) Tier 1 Silver Award awarded by the US Department of Energy (DOE) Office of Electricity. The U.S. Government may have certain rights in this invention.

BACKGROUND OF THE INVENTION

Field of the Invention

The present invention relates to mechanisms for online (real-time) situational awareness of the complex electric power grids to continuously monitor the grid and swiftly detect a variety of fast- and slow-dynamic events in electric power systems. More particularly, the present invention introduces the next-generation smart sensors embedded with advanced analytics that not only ensure high-fidelity measurements at all times, but also provide a swift detection and classification of abnormalities in power grids.

BACKGROUND OF THE RELATED ART

Extensive deployment of Phasor Measurement Units (PMUs) has dramatically changed the traditional sensing and measurement paradigms in power grids into new settings with high-resolution measurements [1]-[5]. Synchrophasors captured from distributed PMUs, which are time-synchronized values representing both the magnitude and phase angle of the sinusoidal waveforms, have transformed many control center applications in power systems. Depending on the type of PMUs, whether Measurement Class (M-Class) with highly-accurate or Protection Class (P-Class) with high-speed low-latency measurement requirements [6], relevant synchrophasor estimation algorithms within the sensors are serving real-time measurements for many end-use applications, e.g., power system model validation, state estimation, dynamic stability assessment, online monitoring, protection and control functions, and post-event analyses.

The existing monitoring and control paradigms in power systems are primarily of centralized architectures. That is, the sensing landscape consists of locally distributed PMU sensors, the measurements from which are collected in distant control centers for monitoring and control decision making. This current practice relies heavily on reliable and secure communication gateways: if the communication channels are lost (due to failures, natural disasters, or man-made cyber-attacks) or have delays (due to communication network congestion, poor channel quality, etc.), the control center analytics' accuracy and application trustworthiness will be compromised or will be attributed a latency. Eliminating the potential risks to communication failures, delays/latencies, and cyber-attacks, system monitoring and control paradigms should enable fusing the online measurements in a distributed manner; that is building in distributed intelligence and translating the data to valuable information closer to where the data is generated.

Additionally, the trustworthiness of the control center functions heavily relies on accurate synchrophasor measurements from PMU sensors; these outputs are obtained from synchrophasor estimation algorithms (SEAs) embedded within the PMUs, which are primarily driven by mathematical approximations. For instance, Discrete Fourier Transform, Kalman Filter, Adaptive Filter, Newton approximations, Phase-Locked Loops, and many other variations exist [7]-[12]. IEEE standard C37.118.1-2011 [6] has defined the expected outputs—magnitude, phase angle, frequency, and rate of change of frequency (ROCOF), and their corresponding desirable accuracy. In most cases, and irrespective of the focused end-use application utilizing the measurements, marketplace PMUs, however, are typically furnished with one SEA only; that may not be able to meet the accuracy and speed requirements under various operating conditions in the grid. This is because the waveforms fed into such sensors have typically variant behaviors; for instance, waveform magnitudes and phase angles go through step changes during faults, and the waveforms could be noisy. Besides, unbalanced load, voltage surge or sag, harmonics, and frequency drift are common phenomena in electrical networks [7]-[13]. Dynamic SEAs based on time-domain signal processing techniques were applied in dealing with the above conditions. However, different applications may enforce different response time and accuracy requirements. Some research efforts proposed a single PMU equipped with only one sophisticated SEA, which is deemed to respond to variant conditions in the grid.

Laboratory tests and field observations have revealed how inefficient the PMU measurements could be, if this "one-size-fits-all" SEA is applied to capture both static and dynamic features and peculiarities in power systems when facing different operating states [14]. To meet the growing demand for high-speed, low-latency, and yet absolutely accurate measurements, a more efficient mechanism which adaptively, and in an automated manner, selects the right SEA at the right time is desired.

SUMMARY OF THE INVENTION

In response to the above limitations, and to tackle the aforementioned challenges and to effectively address fast and slow-transient disruptions in power grids, a smart sensor technology is provided. The smart sensor is a next-generation smart measurement unit deployed in modern power grids for online situational awareness and resilience. Different from the traditional PMUs, the smart sensor enables a paradigm shift from sensing-only to sensing- and-actuating mechanisms—i.e., distributed intelligence—in power grids that can achieve online event detection, classification, and high-fidelity measurements. It encapsulates a suite of SEAs and makes the final output decisions locally. In the smart sensor architecture, three-phase waveforms are acquired from Analog to Digital (A2D) converters; then waveform signatures and dominant features are extracted through Wavelet Transformation (WT)—a time-frequency analysis; specifically, a Pseudo Continuous Quadrature WT (PCQ-WT) to ensure an effective feature extraction (Stage I). The extracted features (scalograms) are next converted to images, and a machine learning mechanism, i.e., the Convolutional Neural Network (CNN), is trained to detect and classify the events happening on the power grid (Stage II). An efficient SEA selection scheme is developed and housed within the smart sensor that adaptively selects the most promising SEA algorithm: when the confidence of a certain event in Stage II exceeds a threshold, the SEA which best fits the detected event is adaptively selected from a set of SEAs that run in parallel, ensuring high-fidelity measurements at all times; otherwise, the default algorithm is selected to estimate the phasor quantities (Stage III).

The description below provides an overview of the smart sensor technology, its configuration, and the embedded analytics. It then presents a background on wavelet transforms and the CNN machine learning mechanism. The analytical advancements that are embedded within the smart sensor technology are elaborated; which includes (i) the suggested PCQ-WT signal processing algorithm for online pattern recognition and feature extraction on electrical waveforms; (ii) the CNN machine learning algorithm for real-time event detection and classification in power grids; (iii) the mechanism for adaptive phasor estimation selection. The numerical analysis of the suggested framework and the smart sensor performance under various operating conditions are elaborated.

These and other objects of the invention, as well as many of the intended advantages thereof, will become more readily apparent when reference is made to the following description, taken in conjunction with the accompanying drawings.

BRIEF DESCRIPTION OF THE FIGURES

FIGS. 3(a)-(f) show a comparison of the STFT vs. Morlet CWT & DB4 CWT on quadrature signal during −2 Hz frequency jump (FIGS. 3(a), (c), (e)) and 40° phase jump (FIGS. 3(b), (d), (f)) events.

FIG. 12 is a diagram of the event detection module with parameters indicated.

FIGS. 13(a), (b) are test results of the event detection and classification module, accuracy is presented in two confusion matrices for αβ-Frame and single phase.

FIG. 13(c) is an event indexing table.

DETAILED DESCRIPTION OF THE INVENTION

Figure 1:
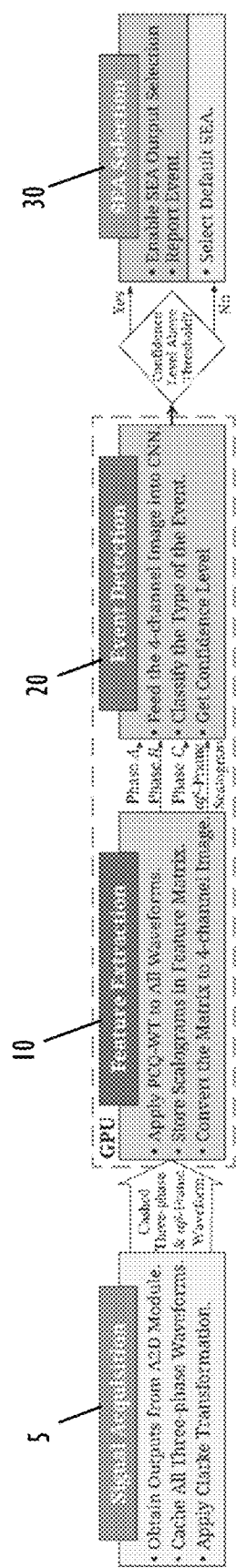
FIG. 1 is a flow diagram of the algorithmic framework embedded within the smart sensor in accordance with the embodiment of the invention.

In describing the illustrative, non-limiting embodiments of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several embodiments of the invention are described for illustrative purposes, it being understood that the invention may be embodied in other forms not specifically shown in the drawings.

It has been demonstrated in the previous literature that a pre-installed SEA inside the PMU sensors need to be chosen carefully or tuned at times to meet the performance requirement of the end-use applications employing the measurements. While exposed to different possible operating conditions in power grid, a particular SEA may best fit one certain type of event. Moreover, an SEA can be tuned with distinct parameters, making it difficult to achieve the desired accuracy at all times. Therefore, the measurement performance of the PMU sensor would be improved if an event type could be detected in real-time and, accordingly, a proper SEA is adaptively selected in an automated manner. Motivated by the above statements, real-time event detection and classification appear to be the core problem.

Voltage and current waveforms in power grids reveal a certain pattern with unique features and peculiarities driven by the system operating conditions. For instance, waveform magnitudes and angles can go through step changes during faults; waveform measurements can be noisy; unbalanced load, voltage surge or sag, harmonics, and frequency drift are also common phenomena. The event classification problem in power grids could be then decomposed into two steps. First, the signatures and dominant patterns from the electrical waveforms, which convey valuable information on the underlying events, are extracted. Second, a classifier is employed for event detection and classification based on the extracted features. The events include abnormal frequency, harmonic distortion, out-of-band interferences, angle and/or magnitude modulation in power waveforms, and faults, among many others.

Turning to the drawings, FIG. 1 shows the workflow of the smart sensor technology. Its functionally has four modules: Signal Acquisition 5, Feature Extraction (Stage 1) 10, Event Detection and Classification (Stage 2) 20, and SEA Selection (Stage 3) 30.

Figure 2:
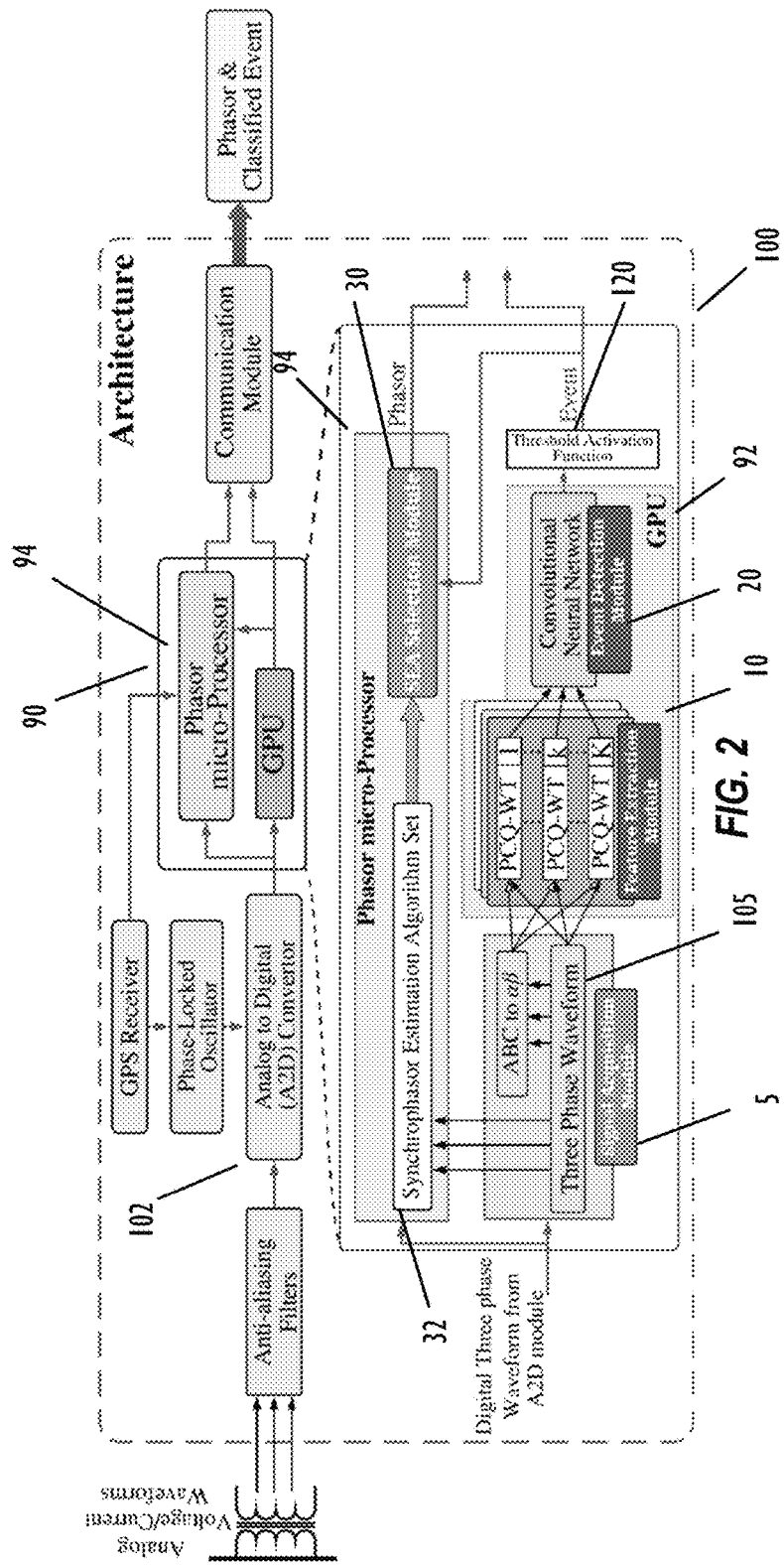
FIG. 2 is an architectural design of the smart sensor technology, hardware configuration.

The Signal Acquisition module 5 shares the same number and type of the Analog to Digital (A2D) processing module 102 (FIG. 2) as in the conventional PMUs. Since no additional A2D module or modifications are required, it makes the architecture an economically-viable sensor solution. The three-phase voltage or current input waveforms from the power grid are first sampled by the A2D converters in module 102 (FIG. 2). The output of the A2D converters are the sampled digital values that can be processed by the subsequent digital processors. The sampled data are loaded into the buffer (Signal Acquisition 5, module 105). Clarke transformation is next applied (as commonly approached to simplify the analysis of the three-phase power circuits) that provide the quadrature-format signals needed for the subsequent modules.

The Feature Extraction module 10 takes both the cached three-phase waveforms (Phase A, Phase B, and Phase C) and the Clarke-transformed signal from the Signal Acquisition Module. In particular, this module applies pseudo-continuous quadrature wavelet transform (PCQ-WT) to these four types of waveforms to extract their features and patterns, i.e., signal signatures. Mathematically, the feature extraction is a type of time-frequency analysis for waveforms. The extracted patterns on the inputted four waveforms are in the form of four scalograms. The scalograms are 2-dimensional (2D) matrices that contain signal signatures corresponding to the events in power grid. To reduce the memory requirements and computational burden, the four generated scalograms are converted into digital images and then combined into one image with 4 channels, where each channel represents one scalogram image. In one embodiment, the PCQ-WT is the feature extraction approach in the smart sensor technology (see below). The above feature extraction process is done in the Graphics Processing Unit (GPU) 92 (and not the regular CPUs) to improve the time efficiency.

The Feature Extraction module 10 feeds the images obtained in the previous stage into the Event Detection and Classification module 20; here the event detection and classification technology uses the Convolutional Neural Network (CNN) 120 in FIG. 2, that classifies the type of the events in power grid. At the same time, the corresponding confidence levels are generated and reported. A convolutional neural network (CNN, or ConvNet) is a class of deep neural networks, most commonly applied to analyzing visual imagery. They are also known as shift invariant or space invariant artificial neural networks (SIANN), based on their shared-weights architecture and translation invariance characteristics. The module 10 passes the 4-channel image (scalograms) into the module 120. The CNN processes the images from module 10 to classify the events with similar patterns in their scalograms. The Event Detection and Classification (Stage 2) 20 recast as an image classification process, where the scalograms are fed into several parallel CNN machine learning modules embedded within the GPU for event detection and classification. The machine learning mechanism will finally detect and classify the event, attributed with a confidence level (i.e., the accuracy of the detection/classification outcome; that is with a confidence level a certain type of event has happened). There are many methods in determining the confidence level such as using normalization, assigning arbitrary number, trial-and-error.

The SEA Selection module 30 (shown more fully in FIGS. 2, 4) selects the outputs from a synchrophasor estimation algorithm set 32 and the outcome is reported by the output channel 34; Modules 30, 32, and 34 are performed inside the phasor micro-processor 94. The result from the event detection module 20 will drive the SEA selection module 30 to select which SEA outputs are going to be used for final measurements in processor 94 to be reported. A threshold activation function which is programmed at the end of CNN 120 determines if the confidence of a certain event exceeds a pre-defined threshold. If so, the corresponding event is reported and the SEA selection module 30 is activated to select the best-fit estimation algorithm from the SEA set, or the default SEA is otherwise used and a normal operating condition (type of the event) is reported. The threshold can be based, for example, on the power grid application using the synchrophasor measurements. For instance, the synchrophasor-based fault location applications require "high-speed" response time, while the synchrophasor-based state estimation applications require "highly-accurate" measurements. The SEA Selection module (Stage 3) 30 will adopt the most promising SEA outputs among a suite of embedded SEAs (high-speed and high-accuracy algorithms) for real-time measurements. If the confidence level is reported lower than the designated threshold (based on the sensitivity setting), the system is concluded to be in its normal operating condition and the default SEA output will be used for accurate measurements.

In one example, the event detection module 20 outputs the confidence levels based on the image classification result, and the threshold can be set by the user or developer (or can be set automatically without manual intervention). The final event classification and activation of SEA selection is achieved by comparing the all confidence levels from module 20 with the threshold. If an event's confidence level is higher, the event is passed into module 30, and module 30 performs the SEA selection.

FIG. 2 shows the overall hardware architecture of the smart sensor 100. The sensor 100 includes anti-aliasing filters, GPS receiver, phase-locked oscillator, A2D converter 102, controller 90 computing brain, and communication module. Anti-aliasing Filters remove the high frequency noise in the analog three-phase waveforms. The GPS receiver gets the timing signal, to synchronize the clock inside the phasor processor and the phase-locked oscillator. The phase-locked oscillator sends the activation signal to the A2D convertor, to perform each sampling process in the conversion. The phasor calculated from the waveform and classified event appeared in the waveform are sent into the commination module. The commination module sends out the phasor and classified event to the user. The controller 90 includes a three-phase waveform buffer 105, synchrophasor estimation algorithm set 32, phasor micro-processor 94, and the Graphics Processing Unit (GPU) 92. The phasor microprocessor 94 performs the output phasor computation of all SEAs. The SEA selection module 30 is programmed inside the phasor micro-processor 94. The GPU 92 is added to accelerate the feature extraction 10 and event detection and classification 20 through the convolutional neural network (CNN) 120.

The sampled three phase waveform captured by the Analog to Digital (A2D) convertor (FIG. 2) module 102 within the presented smart sensor architecture are loaded into the buffer 105 (Signal Acquisition 5). The Clarke transformation is applied on the cached three-phase waveforms to obtain the quadrature format waveform. In Feature Extraction (Stage 1) 10, the original waveforms and Clarke transformed one are individually processed and features matrices (scalograms) are extracted using the suggested Pseudo Continuous Quadrature wavelet transform (PCQ-WT) signal processing algorithm. The wavelet transform outcomes are scalograms (2-D matrix). The Event Detection and Classification (Stage 2) 20 is recast as an image classification process, where the scalograms are fed into several parallel CNN machine learning modules 120 embedded within the Graphical Processing Unit (GPU) for event detection and classification (Module 20). The machine learning mechanism will finally detect and classify the event, attributed with a confidence level.

To prevent CNN from reporting the classified event in an over sensitive way (for example, when the confidence level reported for multiple events are similar, and only one is the highest among the others), the final classified event is obtained by comparing all confidence levels from 20 with a threshold by a threshold activation function. If the threshold is exceeded, the event is reported, or normal operating condition in the grid is concluded otherwise.

One GPU 92 is the only additional hardware required in the system configuration compared to the conventional PMUs, where the GPU shares the same inputs of the phasor processor. The Feature Extraction module and the Event Detection module are performed sequentially and within the GPU to accelerate the computing speed.

This technology can be used either as a standalone event detection and classification tool (sensors), or it can be functionally embedded in the existing PMUs or Intelligent Electronic Devices (IEDs) with PMU functionalities. The technology enables a mechanism that achieves distributed intelligence across the grid, and decisions and control actions can be taken locally. If the aggregated data from the distributed smart sensor can be exchanged with the neighboring nodes, a wider-area control and decision making becomes feasible, too.

In case of stand-alone operation, the sensor is installed in power substations like other sensors and PMUs. The sensor is, however, smart with intelligence embedded for event detection and classification and adaptive measurements. The traditional sensors are only sensing-only devices based on non-adaptive (only one) measurement algorithm and only provide measurements with no information on event detection and classification. The output of our smart sensor as a stand-alone unit will be used for monitoring the grid and for event detection and classification. They will trigger, if needed, active relays, alarm systems and other equipment.

Power Waveform Acquisition

Mathematically, the input analog voltage and current signals from the power grid (i.e., the step-down transformers) to the smart sensor 100 in each phase can be represented as follows:

$$x_{ph}(t)=A_{ph}(t)\cos(2\pi F_h(t)+\phi_{ph}(t)) \quad (1)$$

where $x_{ph}(t)$ is a one-dimension (1-D) waveform measured at each phase; $A_{ph}(t)$, $F_h(t)$, and $\phi_{ph}(t)$ are the instantaneous magnitude, fundamental frequency, and phase angle in each phase, respectively. The waveform in each phase can be expressed by a summation of different orders of harmonic components, as presented in (2):

$$x_{ph}(t) = \sum_{h=1}^{H} A_{ph,h}(t)\cos(2\pi F_h(t) + \phi_{ph,h}(t)), \quad (2)$$

where h is the order of harmonics, and H is the maximum order of harmonic of interest. In different grid operating conditions, different values of $A_{ph,h}(t)$, $F_h(t)$, $\phi_{ph,h}(t)$ will appear in the three-phase power signal, resulting in different patterns and peculiarities. To simplify the time-domain sinusoidal signals analysis and relaxing the need to acquire the rotating reference, Clarke transformation is applied to convert the three-phase signal from ABC- to αβ-frame, as presented in the following:

$$\begin{bmatrix} x_\alpha(t) \\ x_\beta(t) \end{bmatrix} = \begin{bmatrix} \frac{2}{3} & -\frac{1}{3} & -\frac{1}{3} \\ 0 & \frac{\sqrt{3}}{3} & -\frac{\sqrt{3}}{3} \end{bmatrix} \begin{bmatrix} x_A(t) \\ x_B(t) \\ x_C(t) \end{bmatrix} \quad (3)$$

$$x_{\alpha\beta}(t) = x_\alpha(t) + jx_\beta(t) \quad (4)$$

PCQ-WT Based Feature Extraction

Since power waveforms contain various frequency components, multi-resolution waveform analytics are suitable to extract the signal signatures and dominant features, i.e., amplitude, frequency, and phase angle. The most commonly-used technique is the short-time Fourier transform (STFT) and the wavelet analysis [15], [16]. Studies show that STFT is attributed a higher computational burden and time, which leads to a lower time resolution than the wavelet analysis in time-frequency domain [17], [18]. Meanwhile, when comparing the STFT spectrogram in FIGS. 3(a), (b) and the scalogram of the continuous wavelet transform (CWT) in FIGS. 3(c), (d), (e) and (f), it is shown that even though STFT provides higher frequency accuracy, CWT provides more conspicuous performance for feature extraction.

A −2 Hz frequency jump (FIGS. 3(a), (c), (e)) and 40° phase jump (FIGS. 3(b), (d), (f)) events are compared. STFT spectrograms in FIGS. 3(a), 3(b) both show frequency variation in the fundamental frequency. In the high frequency (harmonic order larger than 2) range, the two spectrograms are very similar. So it hard to detect any event, and the only conclusion is that a frequency variation has occurred; however this is not true for the event corresponding to FIG. 3(b). Scalograms from Morlet in FIGS. 3(c), 4(d) stand for two different events. Not only patterns around 192 to 230 show obvious changes, but also patterns around the scale at ~180 to 192 are obviously different. Comparing Scalograms of these two events in DB4 (another wavelet transform approach), the patterns around Scale at 192 to 200 are obviously different in FIGS. 3(e), 3(f).

Furthermore, the event detection module would benefit from the waveform features instead of accurately-measured frequency, since the accurately-measured frequency from STFT can only detect the grid frequency variation but cannot provide any information on the event classification. In this document, therefore, wavelet analysis is selected as the main mathematical tool of interest for online (i.e., real-time) feature extraction and waveform monitoring.

The wavelet transform of a 1-D waveform is achieved by computing the cross-correlation between the signal of interest x(t) and the designated wavelets. This process is defined by the following equation:

$$X(\omega \mid a, b) = \frac{1}{\sqrt{|a|}} \int_{-\infty}^{\infty} x(t)\Psi^*\left(\frac{t-b}{a}\right)dt \quad (5)$$

where, * denotes the complex conjugate; Ψ(t) is a mother wavelet when the scaling factors a=1 and the time shift $$b = 0; \Psi\frac{(t-b)}{a}$$

is the "daughter wavelets" of Ψ(t) with different selection of a and b [19]-[21]. With different selections of a and b, a wavelet bank is then determined. By selecting proper intervals for the continuous scaling factor along with the time shift, a continuous wavelet transform (CWT) is achieved [16]. In real-world applications, where the discrete signal processing is applied, both the integration interval and the number of scaling factors are finite. The daughter wavelets' length, so called the "wavelet window size", is limited and the scaling factor is finite due to the processing capacity limitations of the computing hardware. For all these reasons, the actual behavior of the conventional CWT within the processor is discrete WT with a set of discrete scaling factors $a^i$, wherein i is an integer. In the Pseudo-CWT, i is chosen from a set of linearly-increasing real numbers instead of integers. Similar to the discrete WT, the PCWT with one of the discrete scaling factors is defined as follows:

$$X[\omega | a_k, b_k] = \frac{1}{\sqrt{|a_k|}} \sum_{n=0}^{W-1} x[n]\Psi^*\left[\frac{nT_s - b_k}{a_k}\right] \quad (6)$$

where, Ts denotes the sampling interval, and W stands for the window (buffer) length. In a CWT, each daughter wavelet needs to cover a designated frequency range that reflects the features in time-frequency domain. The central frequency of the daughter wavelets can be approximated by the following relationship with the scaling factor:

$$f = F_c/a_k \quad (7)$$

where, $F_c$ is the central frequency of the mother wavelet [19-20]. When a vector of scaling factors with length K is chosen, the wavelet bank $\Psi$ and the extracted features at time instant n are expressed by the following equation:

$$\Psi^{K \times W} = \left[\Psi\left[\frac{nT_s - b_1}{a_1}\right], \ldots, \Psi\left[\frac{nT_s - b_k}{a_k}\right], \ldots, \Psi\left[\frac{nT_s - b_K}{a_K}\right]\right]^T, \quad (8)$$

$$X_\omega^{K \times 1}[n] = [X_{\omega 1}(a_1, b_1), \ldots, X_{\omega k}(a_k, b_k), \ldots, X_{\omega K}(a_K, b_K)]^T.$$

Where, T is the conventional transpose. To cover a sufficiently wide range of frequency and provide adequate pattern information for time-frequency analysis in any given operating condition in power grid, the central frequency of mother wavelets $F_c$ and the largest scaling factor $a_K$ must satisfy the following condition:

$$F_c/a_K < f_0 < F_c \quad (9)$$

where, $f_0$ is the frequency of the signal of interest. $F_c$ needs to be chosen from a higher frequency range than the maximum frequency of interest and scaled down by $a_k$. Hence, as $a_k$ increases, the corresponding frequency of the PCWT output decreases in the frequency domain.

Once the scaling factors are chosen, then (8) is able to generate the wavelet bank and a series time bin $X_\omega^{K \times 1}$ along the time instants, i.e. the PCWT scalograms are achieved. During the feature extraction process, both transforms require a window (buffer) of samples and, thus, a latency effect indeed exists. Selection of a proper window size could minimize the latency effect, but at the cost of trading off the frequency resolution.

Convolutional Neural Networks (CNNs)

At this stage, we consider the obtained scalograms as 2-D images, and the event classification problem turns into a supervised image classification process. The conventional paradigm for image classification is to manually design the feature extractor and then reduce the dimensionality of the data, where the second phase is to employ a classifier to classify the lower dimensional features. This paradigm highly depends on the efficient design of the feature extractor, and manually designing features for a complex task requires a great deal of human time and effort; it can take decades for an entire community of researchers [21]. In contrast, Convolutional Neural Networks (CNNs) are able to learn the feature extractor automatically and have been proven very successful in the broad range of image-related tasks [22]-[24]. By definition, CNNs are neural networks that use convolution in place of general matrix multiplication in that least one of their layers. In general, the implementation of the convolution is cross-correlations and defined by $$s^p(m, n) = \sum_u \sum_v \sum_w I^u(m+v, n+w) K^p(v, w) \quad (10)$$

where $s^p(m, n)$ is the output of the convolutional layer at position (m, n) and p-th channel, $I^u$ is the u-th channel of the image/data volume, and $K^p$ is the p-th convolutional kernel. A complex convolutional layer is composed of a small number of simple layers expressed by the following:

$$I_l = \text{pool}(\sigma(s)) \quad (11)$$

where, $I_l$ represents the output volume of the l-th layer, $\sigma(\bullet)$ is the non-linearity of the neurons, and pool($\bullet$) is a down sampling procedure. By stacking the convolutional layers, the abstraction capacity of the network generally increases [25].

The representations of the last convolutional layer are expanded to vectors and processed by the general fully-connected layers, which transform the representations with more nonlinearities into spaces with different (higher or lower) dimensions. The final layer of a CNN reduces the dimensionality of the representations to the number of classes; cross-entropy is then employed to measure the "goodness" of the classification (Kullback-Leibler divergence between the predicted distribution and the target distribution) [26]. Finally, gradients of the cross-entropy loss function with respect to the parameters would help train the CNN by back-propagation.

Analytics for Feature Extraction, Event Detection and Classification

The PCQ-WT for Online Feature Extraction

To identify the events in each phase, the corresponding features need to be observed over time. As the positive frequency and phase angles are of interest for both $x_{a,\beta}(t)$ and $x_{ph}(t)$ during synchrophasor measurements, we provide a Quadrature PCWT (PCQ-WT) to extract the waveform features and signal signatures. Meanwhile, the waveform captured in each phase is a real signal, the 1-D waveform (2) can be expanded by the Euler's formula to adopt the quadrature wavelet transform:

$$x_{ph}(t) = \frac{1}{2}\sum_{h=1}^{H} A_{ph,h}(t) e^{j\phi_{ph,h}(t)} \quad (12)$$

$$e^{j2\pi F_h(t)} + \frac{1}{2}\sum_{h=1}^{H} A_{ph,h}(t) e^{-j\phi_{ph,h}(t)}, e^{-j2\pi F_h(t)}$$

The next step is to select an appropriate wavelet and investigate its feasibility for waveform feature extraction. Gabor wavelets have been widely used in two-dimension (2-D) pattern recognition [27]—[29]. In order to simplify the design and enhance the computational efficiency, a modified complex Gabor wavelet is adopted and is written as $$\Psi(t) = \underbrace{\exp(j\omega_c(t-b))}_{\text{Periodic Component}} \cdot \underbrace{\exp\left(-\frac{(t-b)^2}{\alpha_0^2}\right)}_{\text{Gaussian Envelope}} \quad (13)$$

where, $\omega_c$, is the central frequency. The Fourier transform of this Gabor wavelet is $$F_\Psi(\omega) = \alpha_0 \sqrt{\pi} \cdot \exp(-j\omega b) \cdot \exp\left(-\frac{\alpha_0^2}{4}(\omega-\omega_c)^2\right) \quad (14)$$

One can see that the Fourier transform of the Gabor wavelet is also a function on the theme of the Gabor wavelet, although the Gabor wavelet transforms do not follow the orthogonal property since $$|F\Psi(\omega_c \pm \epsilon)| \neq 0 \quad (15)$$

where, $\epsilon$ is a small value. According to (14), this Gabor wavelet possesses a characteristic of predictable narrow bandwidth. By properly selecting $a_0$, one of the Gabor WT can cover a desired range of frequencies and the time shift b plays no magnitude impact on (14) and (15). To ease the derivation, let b=0, then the CWT using the Gabor wavelet for a unit-length phasor with frequency $\omega_0 > 0$ computation turns into $$X^+(\omega_0 \mid a, b=0) = \int_{-\infty}^{\infty} x(t) \Psi^*\left(\frac{t}{a}\right) dt = \int_{-\infty}^{\infty} \exp\left(j\left(\omega_0 - \frac{\omega_c}{a}\right)t - \frac{t^2}{a^2 \alpha_0^2}\right) dt \quad (16)$$

According to the Hubbard-Stratonovich transformation, $$\exp\left(-\frac{\alpha}{2}x^2\right) = \sqrt{\frac{1}{2\pi\alpha}} \int_{-\infty}^{\infty} \exp\left(-\frac{y^2}{2\alpha} - jxy\right) dy. \quad (17)$$

the CWT using the Gabor wavelet in (16) becomes $$X^+(\omega_0 \mid a, b=0) = a\alpha_0 \sqrt{\pi} \exp\left(-\frac{\alpha_0^2}{4}(a\omega_0-\omega_c)^2\right) \quad (18)$$

It can be seen that when $\omega_0 = \omega_c/a$, (18) reaches its maximum and the dominant feature of the expected frequency is revealed. In order to make each frequency of interest share an equivalent maximal magnitude, we make $$\alpha_0 = \omega_c/(\gamma a) \quad (19)$$

where, $\gamma$ is a constant. Hence, in (13), the Gaussian envelope in the Gabor wavelet is adaptive to different frequencies. While applied to the 1-D waveform, the feature corresponding to a unit phasor with negative frequency ($-\omega_0$) is always suppressed, because the CWT of the negative frequency in (20) decreases as $\omega_0$ increases.

$$X^-(-\omega_0 \mid a, b=0) = a\alpha_0 \sqrt{\pi} \exp\left(-\frac{\alpha_0^2}{4}(a\omega_0+\omega_c)^2\right) \quad (20)$$

The discrete form of the Gabor wavelet that is used in a smart sensor is presented as $$\Psi[n \mid a_k, b_k] = \exp\left(j\frac{\omega_c T_s(n-b_k)}{a_k}\right) \exp\left(-\frac{T_s^2(n-b_k)^2}{a_k^2 \alpha_0^2}\right) \quad (21)$$

When applying the complex Gabor wavelet with a set of discrete scaling factors from a set of linearly-increasing numbers, the PCQ-WT is achieved, and it can be written as $$X(\omega_k \mid a_k, b_k=0) = \sum_{n=0}^{W-1} x[n]\Psi^*\left[-\frac{T_s n}{a_k}\right] = \sum_{n=0}^{W-1} x[n]\exp\left(-j\frac{\omega_c}{a_k}T_s n - \frac{T_s^2 n^2}{a_k^2 \alpha_0^2}\right) \quad (22)$$

If one determines the frequencies of interest and designs the Gabor wavelet bank properly, a vector $X_\omega$, consisting a set of PCQ-WTs is achieved, and the PCQ-WT is able to extract the waveform signatures in frequencies of interest via time-frequency analysis, i.e., scalograms are generated.

The CNN for Event Detection & Classification

Pursuing development of an online event detection and classification mechanism, and built on the PCQ-WT extracted features corresponding to various types of events, we provide a machine learning algorithm, i.e., the CNN 120. As discussed earlier, the process of event detection is converted to a supervised classification process on the scalograms. However, the classification on the 2-D scalograms is challenging due to the high dimensionality. Specifically, every frame of the obtained scalogram has scales× time bins dimension (usually hundreds by hundreds); such high-dimensional data is prohibitive in most conventional pattern classification approaches.

We treat the PCQ-WT scalograms as 2-D images and provide a CNN-based architecture to classify the events concealed in the scalograms (images). As the scalogram classification is not with very high abstraction level, the CNN 120 has a simple architecture that meets the requirements of a synchrophasor, yet with very fast test speed. The CNN 120 contains five layers: three convolutional (Conv.) layers and two fully-connected (FC) layers. This framework can be either a standalone tool for event detection and classification or can be functionally embedded within PMUs to assist the phasor processor in selecting a proper SEA in real-time.

The Mechanism for Adaptive Phasor Estimation

The event detection and classification module 20 (FIG. 1) provides valuable information on the grid operating conditions. The one-size-fits-all algorithm within the existing PMUs may neither be sufficient nor accurate in effectively dealing with all types of signals corresponding to different events and operating conditions in power grids. There are several solutions that can be thought in response to this challenge: (i) one very costly solution would be to install several different sensors (each with one different SEA) in each substation for different end-use applications that use the synchrophasor measurements; (ii) the other approach can be to design one very accurate SEA that can work very effectively under all system operating conditions meeting all measurement accuracy and speed requirements, which is extremely hard to achieve considering the hardware limitations as well as the ever-existing trade-off between the speed-accuracy performance requirements for different applications; (iii) one promising and viable approach in line with today's and tomorrow's infrastructure and computation technologies—which we focus on within the smart sensor— is to host a suite of SEAs that work in parallel within the sensor and are selectively and adaptively activated in an automated manner depending on the unfolded system operating condition. Operating in parallel reduces delay of the measurement and increases performance of the synchrophasor monitoring system.

Since it would be highly possible that the best-fit measurements (frequency, phase magnitude and phase angle, ROCOF) may be achieved from several different SEAs under a single event in power systems, an output selector which is loaded with an optimized selecting strategy is needed. The selecting strategy must dynamically switch between one or multiple SEAs.

Figure 4:
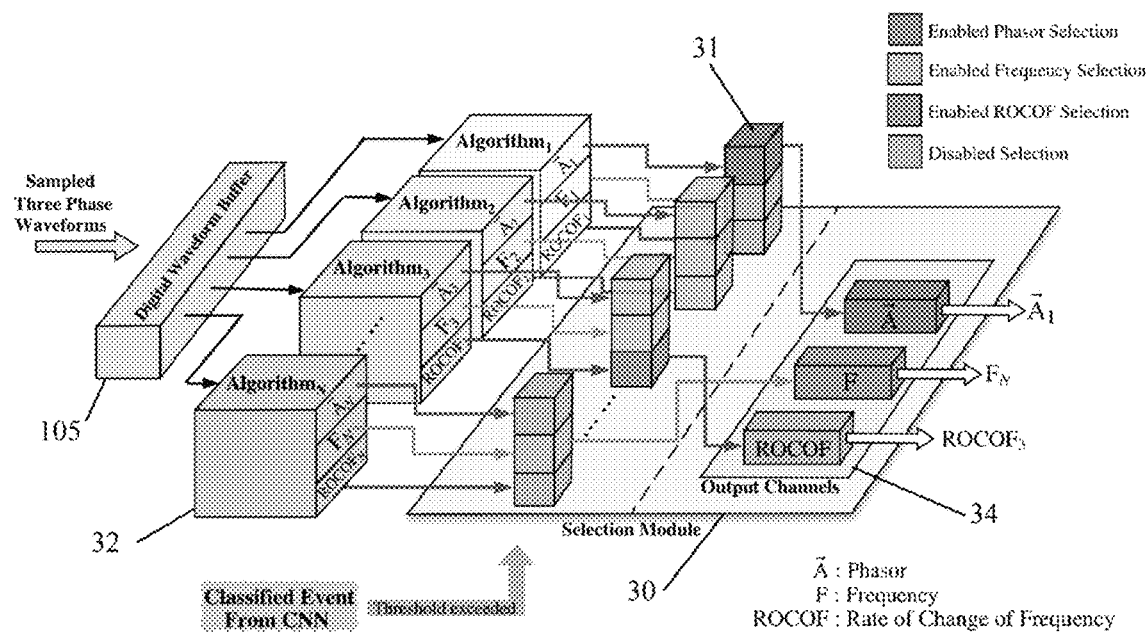
FIG. 4 is an architecture diagram of the SEA selection module.

FIG. 4 shows the detailed architecture of the SEA selection module 30 (FIG. 1). The SEA module 30 has an output selector 31 and output channels 34. For every detected event and identified operating condition in the grid, the CNN 120 actuates the phasor output selector when confidence threshold is exceeded; three best-fit measurements (phasor, frequency and ROCOF) are selected in real-time from algorithm set 32, e.g., phasor measurement from $SEA_1$, frequency measurement from $SEA_N$ and ROCOF measurement from $SEA_3$; meanwhile, all measurements from $SEA_2$ and all other SEAs are disabled.

The selecting strategy is preloaded in the smart sensor before putting into use. Different SEAs can perform differently under various types of events, and the accuracy of the SEAs can vary. The pre-installed SEAs can be tested and examined in the laboratory environment to determine the best-fit event for each SEA, or can be determined automatically without manual intervention. Then the selecting strategy will be determined. The threshold and activation function are determined by the user, and the settings can by affected by the focused application using the measurements, the size and type of the grid, etc. The selection operation is performed in the Phasor processor 94.

Synchrophasor Measurement includes three outputs: phasor, frequency and rate of change of frequency (ROCOF). The Synchrophasor Estimation Algorithm (SEA) is applied to the power waveform in each phase to calculate the three outputs (Phasor, Frequency, ROCOF). For every detected event and identified operating condition, the best-fit measurements could be obtained from either only one SEA, or up to three different SEAs, from which these three outputs are obtained from.

Figure 17A:
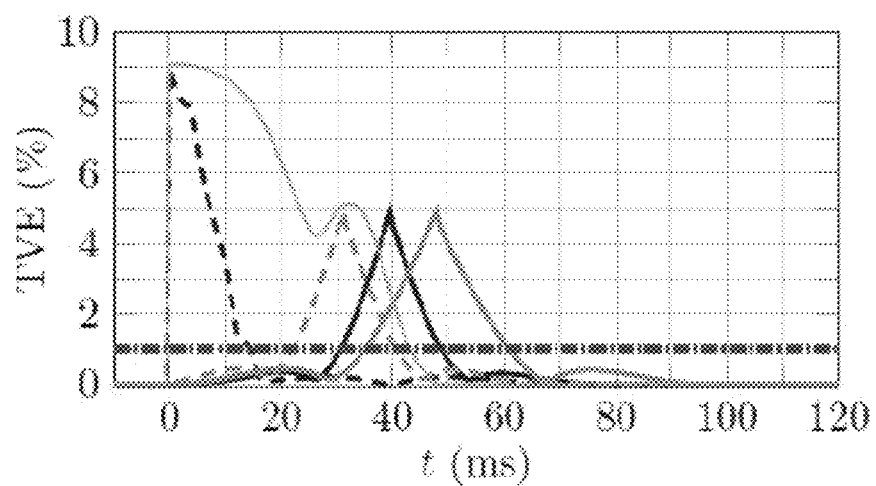
FIGS. 17(a)-(c) show the performance of five different SEAs on an example of magnitude step change event.
Figure 17B:
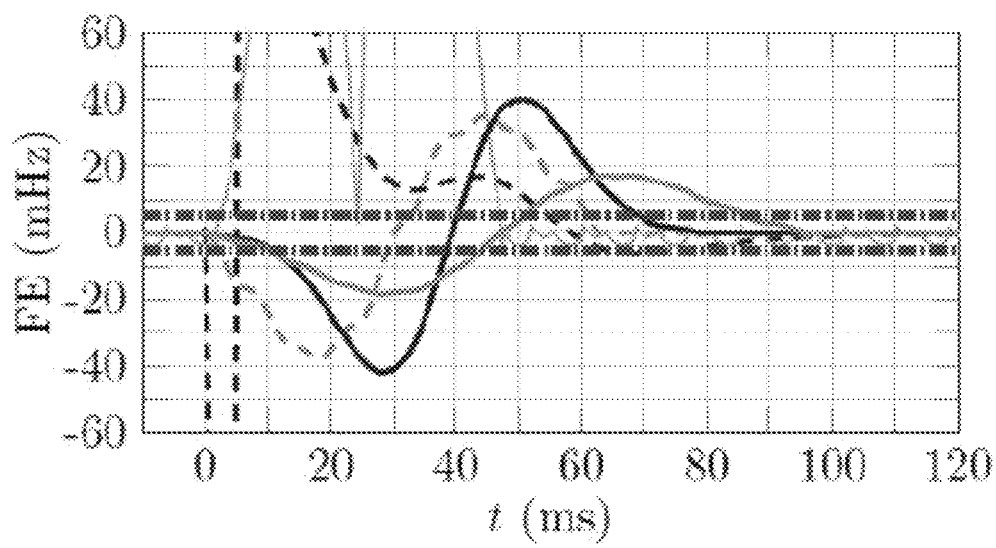
Figure 17C:
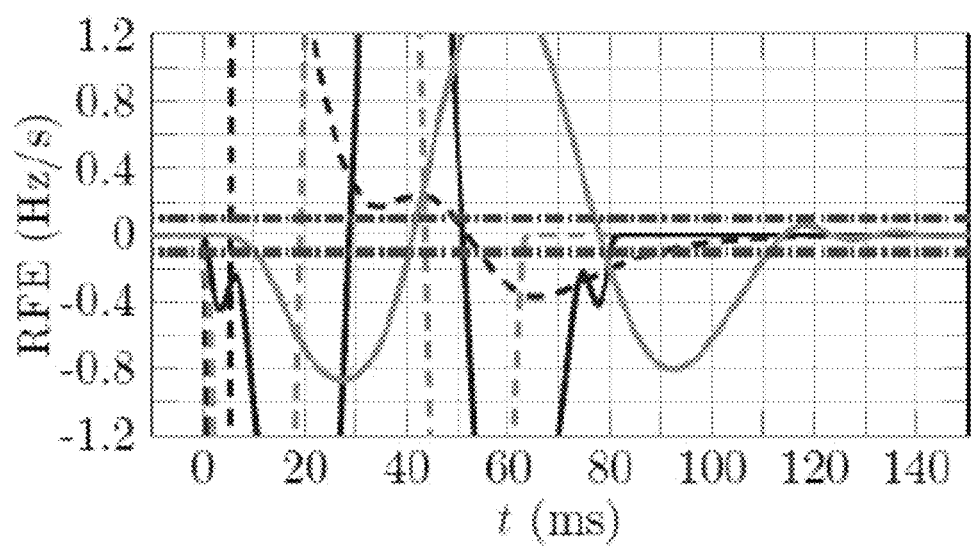

An example of magnitude step change is shown in FIGS. 17(a)-(c) to evaluate the performance of different SEAs under this event; the measurement results are evaluated through measurement errors in three subplots. These evaluated errors are phasor total vector error (TVE), frequency error (FE) and ROCOF error (RFE), and these results are from 5 different SEAs. One can see, that the error convergence speed, error distortion level, and the error magnitudes after convergence are totally different for different SEAs. This highlights the fact that different SEAs react differently when performing the measurements under various events in power grid.

Figure 5:
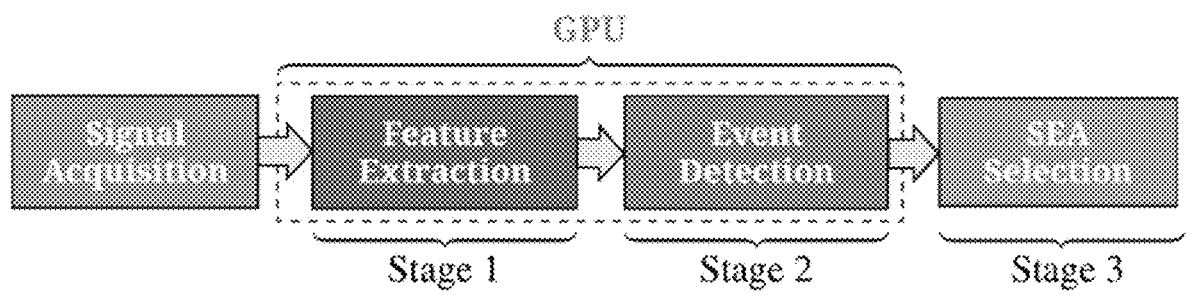
FIG. 5 is a block diagram of the analytics within a smart sensor.

Facilitating a smooth transition to secure, reliable, and resilient power grids of the future, an intelligent sensor technology is provided that harnesses the original waveforms in power grids locally and achieves an auxiliary online surveillance mechanism with fast and accurate event detection, classification, and high-fidelity measurements. In particular, this innovative framework for distributed intelligence has four modules as demonstrated in FIGS. 1, 5: (i) signal acquisition, (ii) feature extraction and pattern recognition, (iii) event detection and classification, and (iv) adaptive synchrophasor estimation algorithm (SEA) selection. Here, we classify the embedded functionalities within the smart sensor into three stages in sequence (see FIGS. 1, 5). The performance of each module is extensively tested and numerically investigated under a variety of conditions. The sensor operates, for example, on abnormal frequency, harmonic distortion, out-of-band interference, angle and/or amplitude modulation, faults, etc.

Waveform Specifications, Configurations, and Assumptions

All the studied modules share a sampling rate of 9.6 kHz at power grid nominal frequency of 60 Hz, where up to $50^{th}$ order (3 kHz) of harmonics is considered in the simulations [6]. According to the Nyquist sampling theorem, the sampling rate used here has a maximum 4.8 kHz coverage as desired. We assumed there is no congestion during data transfer or A2D conversion. Mathematically, the wavelet transform should be able to cover the frequency range from 1 Hz to 3 kHz; the computing complexity of extracting such a frequency range could be reduced while sufficient feature extraction performance is ensured. In the pseudo-continuous quadrature wavelet transform (PCQ-WT) design, we chose the scaling factor $a_k$ ranging from 1 to 256 and in a dyadic dilation manner; i.e., $a_k=2^i$, wherein the exponent i is equally sampled within [0,8]—i.e., pseudo-continuous.

Through this design, the frequency resolution at high frequency range is reduced, as the harmonics are usually sparse along the spectrum which requires less frequency resolution. Meanwhile, at the low frequency range including the fundamental frequency, the resolution is enhanced, since the 60 Hz waveform is of most interest. When considering the feature exaction performance (accuracy and speed), we chose the wavelet transform window size of 0.02 second in real-time, and time bins W=192 in (6). For simplicity, we use a fixed time shift $b_k=96$.

TABLE I

| Test Name | Input Range | Test Name | Input Range |
|---|---|---|---|
| Signal to Noise Ratio (SNR)* | 40 dB | Frequency Step | −5 Hz to 5 Hz |
| Magnitude Step | 0.1-2 pu | Phase Step | ±π/18 radian |
| Harmonic Distortion | 0.5%-10% THD; order up to $50^{th}$ | Out-of-Band Interference | 10 Hz to 120 Hz; level 0.01-0.1 pu |
| Amplitude Modulation | 0.1 Hz to 5 Hz; level 0.005-0.1 pu | Angle Modulation | 0.1 Hz to 5 Hz; level 0.005-0.1 pu |
| Frequency Ramp | ±0.01 Hz/s to ±1 Hz/s, within ±5 Hz | Single-line-to-ground (SLG) fault*** | Magnitude drop 0.2-1 pu |
| Line-to-Line (LL) fault*** | Magnitude drop 0.2-1 pu** | Line-to-line-to-ground (LLG) fault*** | Magnitude drop 0.1-1 pu |

*applied to all test signals.
**Phase shift occurs at faulted lines.
***For αβ-frame signal test only The specifications (test event and corresponding signal parameters) of the input test power waveforms are selected according to [6], [23] as detailed in Table I. Twelve types of waveforms are simulated in total which correspond to various operating conditions in the grid: (i) frequency step change, (ii) magnitude step change, (iii) phase step change, (iv) harmonic distortion, (v) out-of-band interference, (vi) amplitude modulation (AM), (vii) phase angle modulation (PM), (viii) frequency ramp, (ix) single-line-to-ground (SLG) fault, (x) line-to-line (LL) fault, (xi) line-to-line-to-ground (LLG) fault, and the normal operating condition. A Gaussian background noise with signal to noise ratio (SNR) of 40 dB is added to all test waveforms.

Feature Extraction Case Studies and Numerical Results

We here examine the performance of the PCQ-WT feature extraction module (Stage 1) in characterizing distinguishable patterns and signal signatures under a variety of grid operating conditions. For simplicity, the occurrence time of all demonstrated events is assumed the same.

Figure 6A:
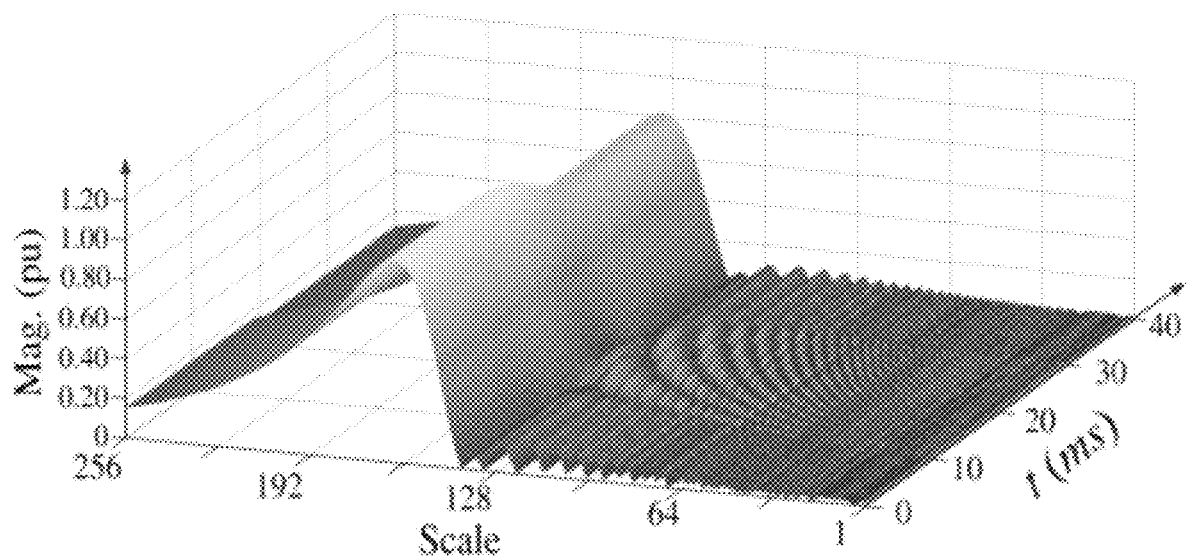
FIGS. 6(a), (b) are extracted features from a simulated magnitude step change event of 0.2 pu at t=10 ms.

Waveform Feature Extraction Under Transient Events:

Several transient events are simulated and analyzed as follows: the magnitude step change event (FIGS. 6(a), (b)), the frequency ramp event (FIGS. 7(a), (b)), and phase angle step change event (FIGS. 8(a)(b)). One can see that the PCQ-WT pattern recognition algorithm has successfully recognized the unique peculiarities in the signals originated from such fast-transient events. Also, the signal patterns and signatures have appeared almost immediately as the events happen, making them absolutely suitable for online applications.

Figure 6B:
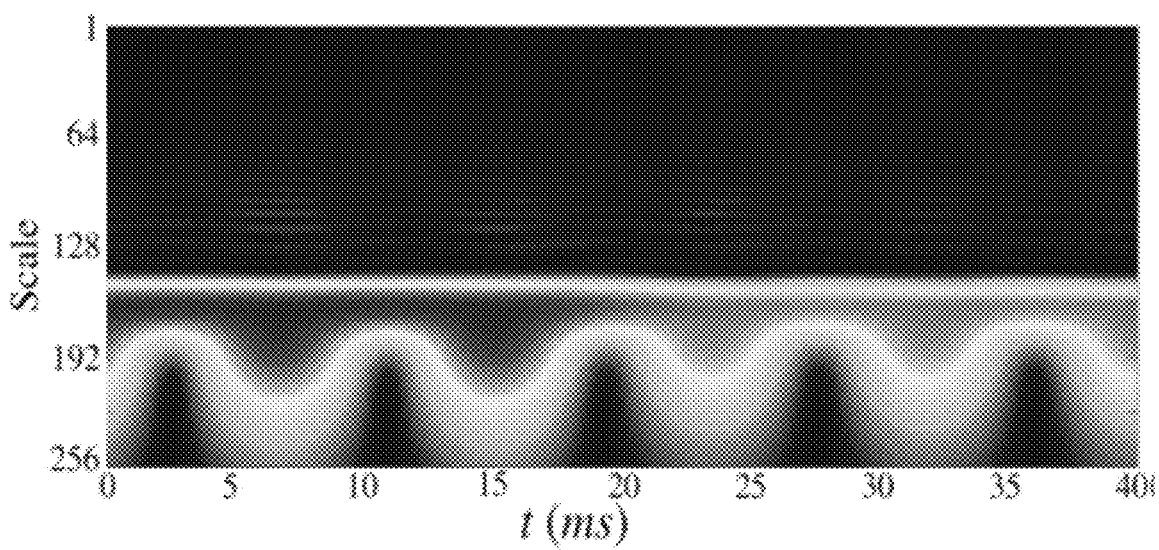

First, several transient events are compared and analyzed below. During the magnitude step change event at t=10 ms—FIG. 6, the intensity/height of the main tune decreases in the scalogram of αβ-frame FIG. 6(a). Similar behavior can be seen in FIG. 6(b), where we can see that the high frequency range (scale from 1 to 160) has less discontinuous patterns and the magnitude step change matches the intensity (dark red) decrease.

Figure 7A:
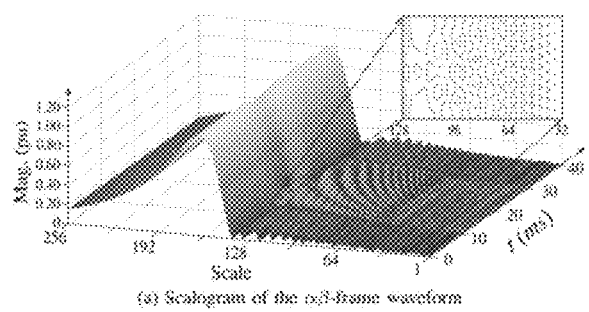
FIGS. 7(a), (b) are extracted features from a simulated frequency step change event of −2 Hz at t=10 ms.
Figure 7B:
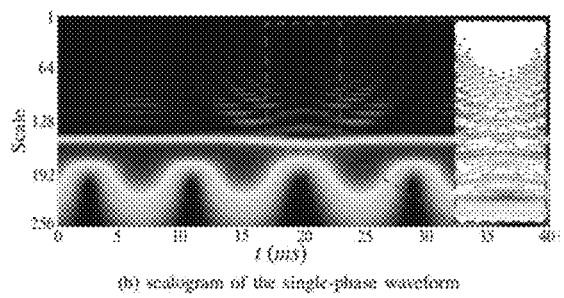
Figure 8A:
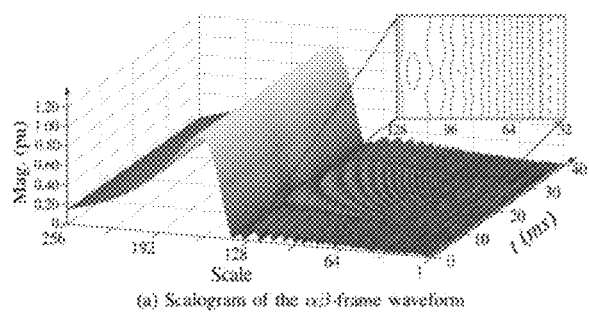
FIGS. 8(a), (b) are extracted features from a simulated phase angle step event of −10° at t=10 ms.
Figure 8B:
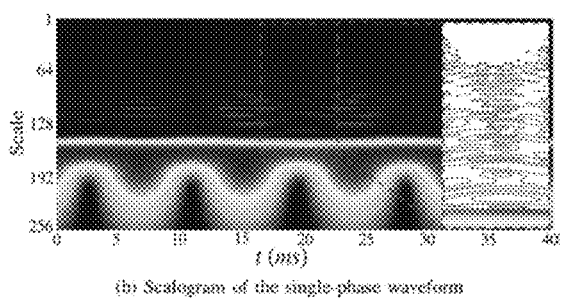

Comparing features of the frequency step event (starts at t=10 ms) which are shown in FIG. 7 and phase step event (starts at t=10 ms) in FIG. 8, the patterns emerging during 10 ms to 30 ms in the αβ-Frame are quite similar, both of them show a valley in the main tune (highest portion) after 10 ms of the events, but the patterns in FIG. 7(a) caused by the frequency step change event is more intermittent than that in the phase step event shown in FIG. 8(a), especially between scale values from 64 to 128. On the contrast, when observing patterns during 15 ms to 25 ms from the features extracted from the single-phase waveform, the differences are obvious: in FIG. 7(b), the patterns from the frequency step change event are symmetric around 20 ms, which is 10 ms after when the event happens. In FIG. 8(b), the phase step change event patterns are disorganized. However, unlike the magnitude step change event, both main tunes (dark red) dim at time t=20 ms, which is 10 ms after the events occur.

Figure 9A:
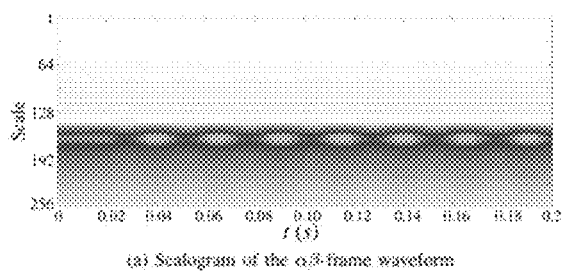
FIGS. 9(a), (b) are extracted features from a simulated out-of-band interference of 100 Hz at t=10 ms.
Figure 9B:
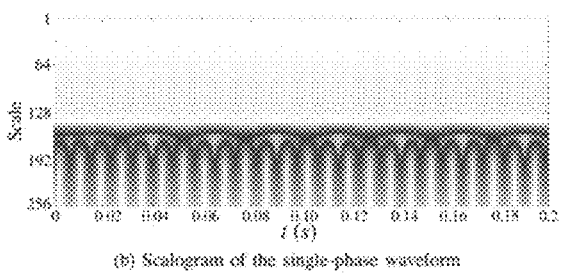

During Out-of-Band inference events (FIGS. 9(a), (b)), periodical patterns have appeared in the main tune; furthermore, the edges (dark gray color between the red and light gray) of the main tune vary periodically. It should be noted that the patterns don't have the same frequency as the inference signal's frequency. This behavior is distinguishable from the features extracted from the Amplitude Modulation event in FIG. 10 and the Angle Modulation event in FIG. 11. For the features extracted from the single-phase waveform in FIG. 9(b), in the main tune as well as its edge are found deformations, and this peculiarity has the same frequency as that in FIG. 9(a).

Figure 10A:
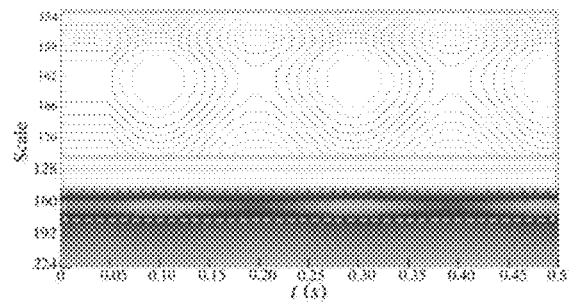
FIGS. 10(a), (b) are extracted features from a simulated amplitude modulation event with magnitude of 0.05 pu and frequency of 5 Hz at t=0.04 s.
Figure 10B:
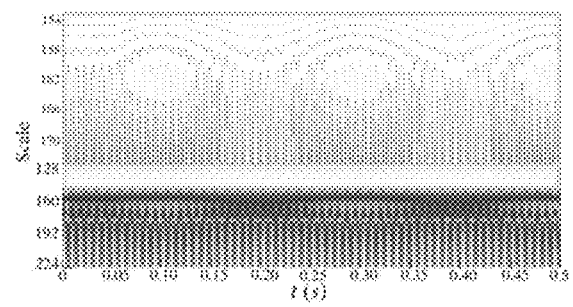
Figure 11A:
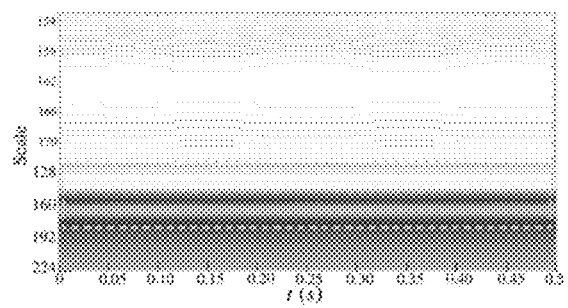
FIGS. 11(a), (b) are extracted features from a simulated phase angle modulation event with magnitude of 0.1 pu and frequency of 5 Hz at t=0.04 s.
Figure 11B:
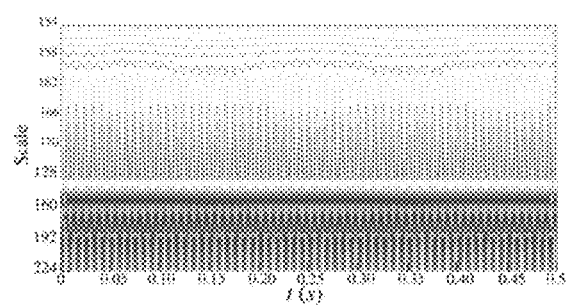

When comparing the Amplitude Modulation and Angle Modulation events, the edge of the main tune is flat, but the pattern differences are obvious: in αβ-Frame, the center of the main tunes (cyan area) of the Amplitude Modulation event in FIG. 10(a) shows periodical variations over time, and this variation is intermittent with clean edges in the zoomed plot. On the contrast, center of the main tunes in FIG. 11(a) from the Angle Modulation event is always continuous. However, both features extracted from FIGS. 10(a), 11(a) show 5 Hz patterns which match the modulation frequency event. A similar phenomenon can be found when comparing the features extracted from the single-phase waveform; FIG. 10(b) shows a discontinuity at the center of the main tune, while the main tune is continuous in FIG. 11(b).

In all, we can see that the proposed PCQ-WT can successfully extract and reveal unique features from both complex αβ-Frame and real single-phase waveforms during different types of events in power grids. Even though the low frequency portion in scalogram is still intermittent for single-phase waveforms, the main tune is still continuous, especially the part closer to the high frequency side of the signal. So, the extracted features can be used as images and fed into the machine learning mechanism through CNN.

Waveform Feature Extraction Under Periodical Events

The flowing comparisons focus on the emergence of the steady-state events with periodical impacts on power waveforms. The simulated events include out-of-band inferences (FIGS. 9(a), (b)), amplitude modulations (FIGS. 10(a), (b)), and phase angle modulations (FIGS. 11(a), (b)), where the PCQ-WT algorithm could successfully extract the unique features in the waveforms; such patterns convey important information on the underlying slow-dynamic events in power grids and can provide a foundation based on which advanced analytics and decision making platforms can operate in real-time.

Event Detection and Classification Module Configuration

The overall framework for online event detection with smart sensors is demonstrated in FIG. 12. Our convolutional neural network (CNN) 122 (FIG. 2) contains five layers: three convolutional (Conv.) and two fully-connected (FC) layers with the following specifications: Input(256×385)–Conv(100, 5×11)–Max-pool(3×3)–Conv(100, 5×5)–Max-pool(3×3)—Conv(64, 5×5)—FC(600)–FC(12). Both αβ-frame and single-phase waveforms are fed into the analytics for a duration of 40 ms (385 time bins), which is treated as the observation window. This is a typical two-layer CNN configuration for image classification. The entire 5 layers form one individual CNN are used in the smart sensor technology.

Unlike the ordinary images which have homogeneous units on the two axes, the axes of the scalograms are with different units. We chose a wide kernel (5×11) in the first convolutional layer that could extract more information for transitions of the scalogram along the time axis. Accordingly, the stride of the convolution operation in the first layer is chosen (2,3), while that of the other convolutional layers is (1,1). Except the last FC layer, batch normalization is used in each Convolution and FC layers for improved speed, performance and stability of artificial neural networks. Dropout was adopted in the third convolutional layer and the first FC layer to prevent over-fitting. Rectified Linear Unit (ReLU) were chosen as nonlinearities in the neural network. The CNN used cross-entropy as the loss function. Additional details of the CNN 120 (e.g., the number of convolutional kernels) can be seen in FIG. 12. One should note that there are four CNNs shown in FIG. 12; these four CNNs share extract same architectures and need to be trained twice; since Phase A, B, and C are symmetric, they share one CNN that has the same parameters, while the other CNN that has different parameters is used for αβ-Frame. Four CNNs can be utilized, for example, for the Phase A, B, C plus Clarke transformed waveforms.

In this experiment, we generated 10,000 samples for each type of event for training and another 1,000 samples of each type for validation the training outcome. Total twelve types of events are used for training the CNNs. The occurrence time of all events was randomly located within the 20 ms run-time window, and the phase of the waveform was randomly selected, too. The three-phase event detection are based on features extracted from the αβ-Frame waveform by CNN4, because it utilizes the most information from the waveforms and fault types are hard to be identified through single-phase waveform (note that in the training of CNNs—CNN1, CNN2, CNN3—fault types are not included for single-phase event detection). Therefore, nine types of events are considered in the single-phase event detection and classification. And the SEA selection is based on the events classified through the single-phase waveform. Finally, another 1,000 samples of each type event are generated for blind testing and to verify the detection accuracy.

Event Detection and Classification Experiment Results and Numerical Analysis

Event Detection Accuracy

The best test results are summarized in the two confusion matrices in FIGS. 13(a), (b), and the overall accuracy of αβ-Frame and single-phase are 94.70% and 90.20% respectively. The true label stands for the actual type of test events, and the predicted label is the classification outcomes of the CNN modules. For example, in FIG. 13(a) for αβ-Frame detection result, along the first row of the true label axis which is also the column marked by "1. Normal" in the predicted label, 98.5% of 1000 samples which are labeled as "normal condition" are classified as "normal", which matches the true type of that particular event. Similarly, in FIG. 13(a) row "2. Frequency Step", among 1,000 samples of Frequency Step change event, two are mistakenly classified as "Normal" (marked by 0.2%); 99.1% are correctly classified as "Frequency Step"; Five are mistakenly classified as "Phase Step"; One is mistakenly classified as "Angle Modulation".

Based on these two confusion matrices and comparing the individual accuracy rate for each type of event, the detection accuracy of transient events is relatively higher than the steady-state events. As the observation window is set to be 40 ms, it is hard to detect within such a short time the modulation event with low frequency or the slow frequency ramp event. It can be seen at FIGS. 13(a) and (b), events "7. Amplitude Modulation", "8. Angle Modulation," and "9. Frequency Ramp" are tended to be classified as "normal". However, this issue can be neglected because slow variations can be easily found and measured by conventional SEAs.

Online Classification Application

The previous analysis verified the accuracy of the event detection scheme; we also conduct an online event detection and classification experiment using the combined feature extraction tool and detection mechanism. Note that the feature extraction takes 1.20±0.23 ms and event classification through CNN takes 1.04±0.31 ms in Python environment. As the total time for event detection is 2.24±0.39 ms, which is much less than one fundamental cycle of the power system (16 ms), the mechanism can be applied for online detection. We use synthetic waveforms to test the online classification performance. The observation window (40 ms duration of features) is generated every 4 ms, which is larger than the combined processing time for the purpose of avoiding congestion.

Figure 14:
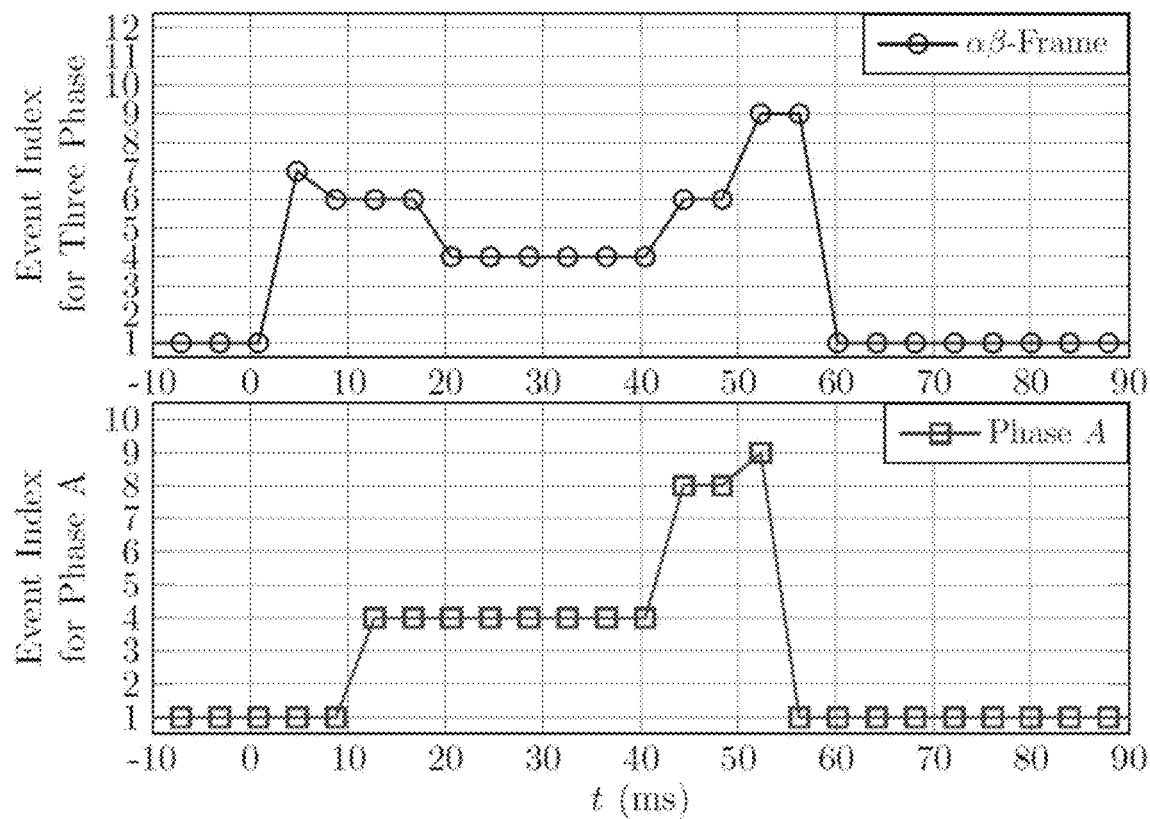
FIG. 14. Online event classification test result: angle step change occurs at t=0ms, the Event Index is listed in FIG. 13(c).

An example of online Angle Step Event experiment is shown in FIG. 14. The numbers along Y-axis stand for the event indexing in FIG. 13; the X-axis is time in ms. We can see that it took totally 20 ms for the scheme to detect the correct event in αβ-channel, and it only took 12 ms to detect the correct event in Phase A. It can be noticed that, classification delay and residual do exist, because the event is hard to be classified before the corresponding event pattern fully moves into the observation window. Similarly, when the pattern starts to move out of the observation window but before fully vanishing, the classification is not accurate. However, this inaccurate output only exists for 20 ms, which is 1.2 fundamental cycle; this delay is still within the limit and acceptable. Meanwhile, as it can be seen in FIGS. 6-8, the center of patterns from the transient event can be observed after 10 ms of the occurrence. For conservative estimation, the fingerprint of the event can be revealed and classified after one fundamental cycle (16.67 ms) plus 2.24±0.39 ms, which is approximated 20 ms as well. Therefore, the scheme can meet the granularity limit and achieve the desired real-time performance.

Figure 15:
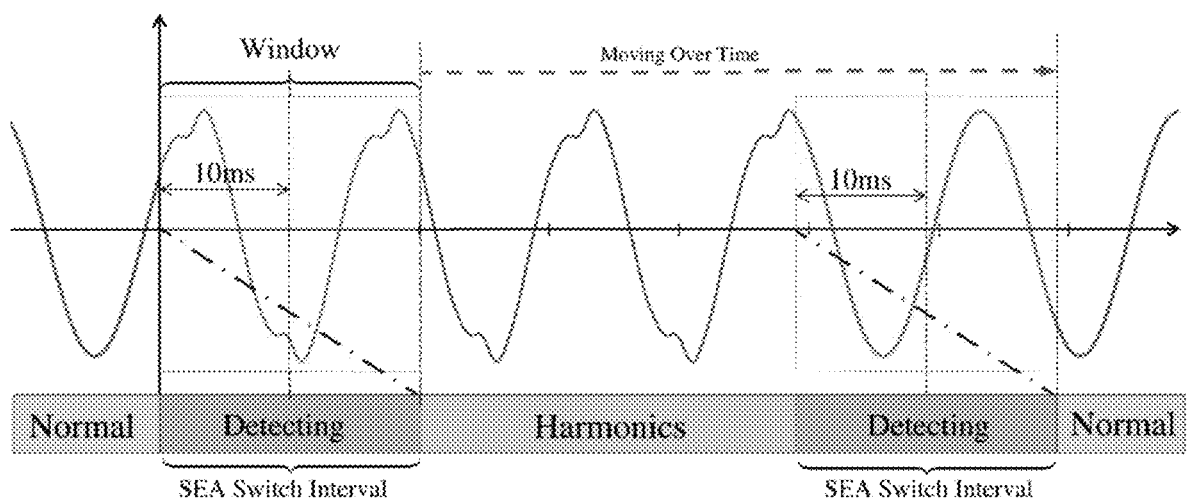
FIG. 15 is an example of online event classification and SEA selection during occurrence of harmonic distortion event.

An example of the SEA selection is demonstrated in FIG. 15, with occurrence of harmonic distortion: the detecting interval (20 ms) is marked as pink, the SEA selection is expected to be completed within this 20 ms. When the harmonic distortion disappears, and waveform returns to normal, it will take maximum 20 ms to switch back to SEA for normal operation. In order to examine the online event detection and classification performance, we used a workstation with a stock Intel Core i7-9700K CPU as the computational platform. We transfer the PCQ-WT and CNN modules into Matlab 2019a to record the computational time on CPU. The overall time for processing the PCQ-WT and CNN is 6.9±2.7 ms (real-time). A better performance could be expected if the entire feature extraction and event detection processes are done in GPU.

Figure 16:
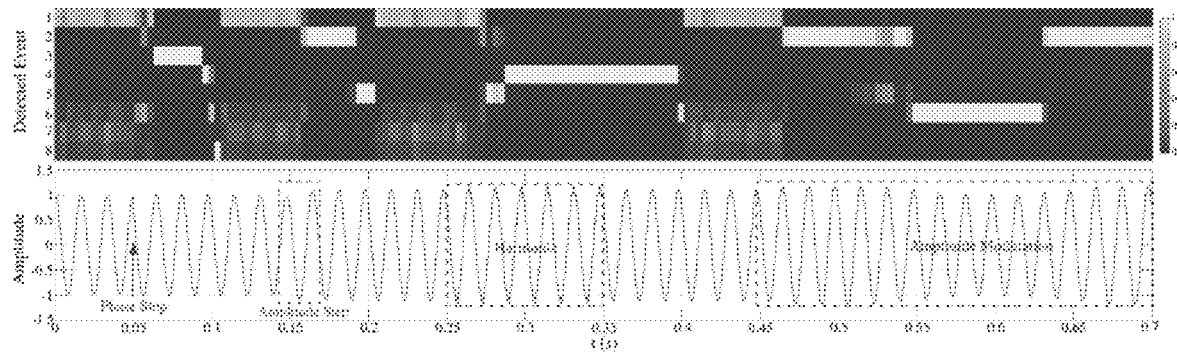
FIG. 16 shows the performance of the online event detection module when applied to a range of simulated events on a single-phase voltage waveform: detected result (top) and original waveform (bottom).

We also test the framework on a record waveform of duration 0.7 s, the result of which is shown in FIG. 16. The top heat-map is the event detection results over time, where the confidence rate of the classification is marked with different colors. One should notice that, during Normal operating condition, the confidence rate is not very high, but the classification is still correct. Detection errors always exist during the transients between two different events. The Phase Step is detected correctly within 10 ms and it takes another 40 ms to return back to normal; similar result can be observed for the Amplitude Step event. Since Amplitude Modulation reveals similar Patterns when compared to the Amplitude Step event (bottom plot), the CNN module classified it as the Amplitude Step, but when the magnitude starts decreasing, the CNN module shows a low confidence rate in classifying the event as Amplitude Step and then selects the event correctly. To avoid this mis-classification particularly for slow-dynamic and long-impact events, a wider observation window can be used, which will compromise the time efficiency in detecting the transient events.

CONCLUSION

This document introduces the next-generation smart sensor 100 in power grids that is embedded with innovative data-driven analytics for event detection, classification, and accurate measurements. Expressly, a new multi-resolution online signal processing tool, the PCQ-WT, is dedicated to waveform pattern recognition and feature extraction under variant grid operating conditions such as frequency variations, magnitude changes, phase angle step changes, harmonic distortion, amplitude or angle modulations, etc. An online machine learning mechanism, the CNN 120, is provided that processes the extracted features, detects and classifies a variety of events in the power grid. An adaptive mechanism, the event detection module 20, is housed within the sensor that, based on the detected event, selects the best-fit synchrophasor algorithm in real-time.

The technology transforms the existing sensing-only mechanisms to sensing-and-actuating paradigms with distributed intelligence. The framework achieves high accuracy and fast speed for real-time event detection and classification. A new concept of adaptive SEA selection within the sensor selects the best estimation algorithm in real-time (depending on the detected event) and ensures high-fidelity measurements at all time. The analytics can be implemented on a standalone sensor or can be embedded in the existing PMUs. However, awareness on the performance of the pre-deployed SEAs is crucial for the successful measurements of the smart sensor. Different SEAs perform differently in various types of events, and the accuracy of SEAs varies under different scenarios, too. Therefore, the pre-installed SEAs can be tested and examined in the laboratory environment to determine their best-fit events and their performance according to their response time, accuracy, etc. Under certain circumstance, one or more outputs from one SEA would not be valid.

In addition, performance of the framework can be further improved when detecting both fast- and slow-dynamic transient and static events. The types of the events in the power grid vary in a wide range. Some occur very fast (fast-dynamic) and some emerge very slow (slow-dynamic), but such fast or slow dynamic events would have significant impacts on the SEA measurements. Therefore, to successfully detect all types of events in the grid, other Feature Extraction methods, including but not limited to PCQ-WT, can be used. At the same time, in the Event Detection and Classification module, other neural network technologies such as long short term memory (LSTM) or others can be used.

Both feature extraction and event detection functionalities can be transferred into GPUs to further improve the smart sensor's performance, computationally. Under the scenario that an amplitude modulation event happens in the grid, Module 10 extracts the features corresponding to this event, and based on the features provided by Module 10, Module 20 will evaluate those features and detect and classify the event by giving confidence levels to possible types of events that match the extracted features. If the confidence level is higher than, for example, 50%, then, Module 20 will report the corresponding event and Module 30 will select the SEA outputs (phasor, frequency, ROCOF) which have the highest accuracy under the amplitude modulation event. In one embodiment of a transmission system, the Module 100 can be installed at substations (where data is generated); in distribution system, Module 100 can be installed at critical nodes. The sensor provides fast detection and classification, within 10-30 ms and 1-2 cycles with distributed intelligence in the power grid.

The following documents are incorporated herein by reference:

[1] J. A. de la O Serna, "Synchrophasor measurement with polynomial phase-locked-loop Taylor-Fourier filters," *IEEE Transactions on Instrumentation and Measurement*, vol. 64, no. 2, pp. 328-337, February 2015.

[2] M. Bertocco, G. Frigo, C. Narduzzi, C. Muscas, and P. A. Pegoraro, "Compressive sensing of a Taylor-Fourier multi-frequency model for synchrophasor estimation," *IEEE Transactions on Instrumentation and Measurement*, vol. 64, no. 12, pp. 3274-3283, 2015.

[3] M. H. Rezaeian Koochi, P. Dehghanian, S. Esmaeili, P. Dehghanian, and S. Wang, "A synchrophasor-based decision tree approach for identification of most coherent generating units," in *Annual Conference of the IEEE Industrial Electronics Society*, October 2018, pp. 71-76.

[4] S. Wang, P. Dehghanian, and B. Zhang, "A data-driven algorithm for online power grid topology change identification with PMUs," in *IEEE Power Energy Society General Meeting (PESGM)*, 2019, pp. 1-5.

[5] T. Becejac, P. Dehghanian, and M. Kezunovic, "Analysis of PMU algorithm errors during fault transients and out-of-step disturbances," in *IEEE PES Trans. & Distr. Conference—Latin America*, 2016, pp. 1-6.

[6] "IEEE standard for synchrophasor measurements for power systems," *IEEE Std C37.118.1-2011*, pp. 1-61, 2011.

[7] D. Macii, D. Petri, and A. Zorat, "Accuracy analysis and enhancement of DFT-based synchrophasor estimators in off-nominal conditions," *IEEE Transactions on Instrumentation and Measurement*, vol. 61, no. 10, pp. 2653-2664, October 2012.

[8] J. Liu, F. Ni, P. A. Pegoraro, F. Ponci, A. Monti, and C. Muscas, "Fundamental and harmonic synchrophasors estimation using modified Taylor-Kalman filter," in *IEEE International Workshop on Applied Measurements for Power Systems (AMPS)*, 2012, pp. 1-6.

[9] J. A. de la 0 Serna and J. Rodriguez-Maldonado, "Taylor-Kalman-Fourier filters for instantaneous oscillating phasor and harmonic estimates," *IEEE Transactions on Instrumentation and Measurement*, vol. 61, no. 4, pp. 941-951, April 2012.

[10] V. V. Terzija, M. B. Djuric, and B. D. Kovacevic, "Voltage phasor and local system frequency estimation using Newton type algorithm," *IEEE Transactions on Power Delivery*, vol. 9, no. 3, pp. 1368-1374, 1994

[11] M. Chen, L. Peng, Q. Zhao, X. Zou, X. Wang, and X. Wei, "Positive sequence detector based on cascaded delayed quadrature signal cancellation," in *2015 IEEE Energy Conversion Congress and Exposition (ECCE)*, September 2015, pp. 1089-1094.

[12] S. Golestan and J. M. Guerrero, "Conventional synchronous reference frame phase-locked loop is an adaptive complex filter," *IEEE Trans. on Industrial Electronics*, vol. 62, no. 3, pp. 1679-1682, March 2015

[13] S. Wang, P. Dehghanian, M. Alhazmi, and M. Nazemi, "Advanced control solutions for enhanced resilience of modern power-electronic interfaced distribution systems," *Journal of Modern Power Systems and Clean Energy*, vol. 7, no. 4, pp. 716-730, 2019.

[14] T. Becejac, P. Dehghanian, and M. Kezunovic, "Probabilistic assessment of PMU integrity for planning of periodic maintenance and testing," in *IEEE International Conference on Probabilistic Methods Applied to Power Systems (PMAPS)*, 2016, pp. 1-6.

[15] D. P. Mishra, S. R. Samantaray, and G. Joos, "A combined wavelet and data-mining based intelligent protection scheme for microgrid," *IEEE Transactions on Smart Grid*, vol. 7, no. 5, pp. 2295-2304, September 2016.

[16] S. Wang, P. Dehghanian, L. Li, and B. Wang, "A machine learning approach to detection of geomagnetically induced currents in power grids," in *IEEE Industry Applications Society (IAS) Annual Meeting*, 2019, pp. 1-7.

[17] Y.-C. Su, K.-L. Lian, and H.-H. Chang, "Feature selection of non-intrusive load monitoring system using STFT and wavelet transform," in *IEEE International Conference on e-Business Engineering (ICEBE)*, 2011, pp. 293-298.

[18] I. Bayram, "An Analytic Wavelet Transform with a Flexible Time-Frequency Covering," in *IEEE Transactions on Signal Processing*, vol. 61, no. 5, pp. 1131-1142, Mar. 1, 2013.doi: 10.1109/TSP.2012.2232655.

[19] M. Stephane, "A wavelet tour of signal processing". Elsevier, 1999.
[20] S. Mallat and W. L. Hwang, "Singularity detection and processing with wavelets," IEEE Transactions on Information Theory, vol. 38, no. 2, pp. 617-643, March 1992.
[21] I. Goodfellow, Y. Bengio, and A. Courville, Deep Learning. MIT Press, 2016, http://www.Deeplearningbook.org.
[22] A. Krizhevsky, I. Sutskever, and G. E. Hinton, "Imagenet classification with deep convolutional neural networks," in *Advances in Neural Information Processing Systems*, 2012, pp. 1097-1105.
[23] K. Simonyan and A. Zisserman, "Very deep convolutional networks for large-scale image recognition," *arXiv preprint*, arXiv: 1409.1556, 2014.
[24] L. A. Gatys, A. S. Ecker, and M. Bethge, "Image style transfer using convolutional neural networks," in *Proceedings of the IEEE Conference on Computer Vision and Pattern Recognition*, 2016, pp. 2414-2423.
[25] Y. Bengio, A. Courville, and P. Vincent, "Representation learning: A review and new perspectives," *IEEE Transactions on Pattern Analysis and Machine Intelligence*, vol. 35, no. 8, pp. 1798-1828, 2013.
[26] J. S. Bridle, "Probabilistic interpretation of feedforward classification network outputs, with relationships to statistical pattern recognition," in *Neurocomputing. Springer*, 1990, pp. 227-236.
[27] Z. Zhang, M. Lyons, M. Schuster, and S. Akamatsu, "Comparison between geometry-based and Gabor-wavelets-based facial expression recognition using multi-layer perceptron," in *Proceedings Third IEEE International Conference on Automatic Face and Gesture Recognition*, April 1998, pp. 454-459.
[28] B. S. Manjunath and W. Y. Ma, "Texture features for browsing and retrieval of image data," *IEEE Transactions on Pattern Analysis and Machine Intelligence*, vol. 18, no. 8, pp. 837-842, August 1996.
[29] J. V. B. Soares, J. J. G. Leandro, R. M. Cesar, H. F. Jelinek, and M. J. Cree, "Retinal vessel segmentation using the 2-d gabor wavelet and supervised classification," *IEEE Transactions on Medical Imaging*, vol. 25, no. 9, pp. 1214-1222, September 2006.

The system and method of the present invention include operation by one or more processing devices, including the GPU 92 and the phasor micro-processor 94. It is noted that the processing device can be any suitable device, such as a computer, server, mainframe, processor, microprocessor, PC, tablet, smartphone, or the like. The processing devices can be used in combination with other suitable components, such as a display device (monitor, LED screen, digital screen, etc.), memory or storage device, input device (touchscreen, keyboard, pointing device such as a mouse), wireless module (for RF, Bluetooth, infrared, WiFi, etc.). The information may be stored on a storage medium such as a computer hard drive, on a CD ROM disk or on any other appropriate data storage device, which can be located at or in communication with the processing device.

The entire process is conducted automatically by the processing device, and without any manual interaction. Accordingly, unless indicated otherwise the process can occur substantially in real-time without any delays or manual action. As used herein, the term "medium" refers to one or more non-transitory physical media that together store the contents described as being stored thereon. Embodiments may include non-volatile secondary storage, read-only memory (ROM), and/or random-access memory (RAM).

The foregoing description and drawings should be considered as illustrative only of the principles of the invention. The invention may be configured in a variety of shapes and sizes and is not intended to be limited by the embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. A smart sensor for use in a power grid, comprising:
a feature extraction module that acquires an input three-phase waveform, extracts waveform signatures and dominant features through a pseudo continuous quadrature wavelet transformation (PCQ-WT), and converts the extracted features to an image;
an event detection module having a convolutional neural network (CNN) trained to detect and classify an event on the power grid, classify the extracted feature image from said feature extraction module, and determine if a confidence level of the classification exceeds a threshold; and
a synchrophasor estimation algorithm (SEA) selection module that adaptively selects, based on the detected event, an algorithm from amongst a plurality of SEAs based on the classification when the confidence level of the classification exceeds the threshold, and output high-fidelity measurements from the selected algorithm.

2. The sensor of claim 1, wherein the high-fidelity measurements comprise phasor, frequency and/or rate of change of frequency.

3. The sensor of claim 1, wherein the extracted features comprise scalograms.

4. The sensor of claim 3, wherein the scalograms are matrices that contains signal signatures corresponding to events on the power grid.

5. The sensor of claim 4, wherein the scalograms are converted to images by quantizing the scalograms to digital images to compress data size.

6. The sensor of claim 1, wherein the plurality of SEAs run in parallel to ensure high-fidelity measurements at all times.

7. The sensor of claim 1, wherein the SEA selection module selects a default algorithm to estimate phasor quantities, when the confidence level of the classification does not exceed the threshold.

8. The sensor of claim 1, wherein said CNN operates in real time.

9. The sensor of claim 1, said sensor operating in real time.

10. The sensor of claim 1, wherein said sensor can be a standalone unit.

11. The sensor of claim 1, wherein said sensor can be integrated within a Phasor Measurement Unit.

12. A method for a power grid, comprising:
acquiring by a feature extraction module of a smart sensor, an input three-phase waveform, extracting waveform signatures and dominant features through a pseudo continuous quadrature wavelet transformation (PCQ-WT), and converting the extracted features to an image;
detecting and classifying at an event detection module having a convolutional neural network (CNN) at the smart sensor, an event on the power grid, classifying the extracted feature image from said feature extraction module, and determining if a confidence level of the classification exceeds a threshold; and adaptively selecting at a synchrophasor estimation algorithm (SEA) selection module at the smart sensor, based on the detected event, an algorithm from amongst a plurality of SEAs based on the classification when the confidence level of the classification exceeds the threshold, and outputting high-fidelity measurements from the selected algorithm.

13. The method of claim 12, wherein the high-fidelity measurements comprise phasor, frequency and/or rate of change of frequency.

14. The method of claim 12, wherein the extracted features comprise scalograms.

15. The method of claim 14, wherein the scalograms are matrices that contains signal signatures corresponding to events on the power grid.

16. The method of claim 15, further comprising converting the scalograms to images by quantizing the scalograms to digital images to compress data size.

17. The method of claim 12, wherein the plurality of SEAs run in parallel to ensure high-fidelity measurements at all times.

18. The method of claim 12, further comprising selecting at the SEA selection module, a default algorithm to estimate phasor quantities, when the confidence level of the classification does not exceed the threshold.

19. The method of claim 12, wherein the CNN operates in real time.

20. The method of claim 12, wherein the smart sensor operates in real time.

* * * * *